(12) United States Patent
Yu et al.

(10) Patent No.: US 11,881,507 B2
(45) Date of Patent: Jan. 23, 2024

(54) REDUCING PARASITIC CAPACITANCE IN SEMICONDUCTOR DEVICES

(71) Applicant: Taiwan Semiconductor Manufacturing Co., Ltd., Hsinchu (TW)

(72) Inventors: Chia-Ta Yu, New Taipei (TW); Hsiao-Chiu Hsu, Hsinchu (TW); Feng-Cheng Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/868,678

(22) Filed: Jul. 19, 2022

(65) Prior Publication Data

US 2022/0376044 A1     Nov. 24, 2022

Related U.S. Application Data

(63) Continuation of application No. 17/198,774, filed on Mar. 11, 2021, now Pat. No. 11,437,469.

(Continued)

(51) Int. Cl.
*H01L 29/06* (2006.01)
*H01L 27/08* (2006.01)
(Continued)

(52) U.S. Cl.
CPC .... *H01L 29/0649* (2013.01); *H01L 21/76224* (2013.01); *H01L 27/0886* (2013.01);
(Continued)

(58) Field of Classification Search
CPC ............. H01L 29/0649; H01L 29/6681; H01L 29/785; H01L 27/0886; H01L 21/76224
(Continued)

(56) References Cited

U.S. PATENT DOCUMENTS 11,302,802 B2 *  4/2022  Wang ................ H01L 21/32136
11,437,469 B2 *  9/2022  Yu .......................... H01L 29/785
(Continued)

FOREIGN PATENT DOCUMENTS

CN        108630699 A      10/2018

OTHER PUBLICATIONS

Korean Application No. 10-2021-0058663, Korean Intellectual Property Office, Notice of Allowance, dated Jan. 30, 2023, 8 Pages.

*Primary Examiner* — Monica D Harrison
(74) *Attorney, Agent, or Firm* — HAYNES AND BOONE, LLP

(57) ABSTRACT

A semiconductor structure includes semiconductor layers disposed over a substrate and oriented lengthwise in a first direction, a metal gate stack disposed over the semiconductor layers and oriented lengthwise in a second direction perpendicular to the first direction, where the metal gate stack includes a top portion and a bottom portion that is interleaved with the semiconductor layers, source/drain features disposed in the semiconductor layers and adjacent to the metal gate stack, and an isolation structure protruding from the substrate, where the isolation structure is oriented lengthwise along the second direction and spaced from the metal gate stack along the first direction, and where the isolation structure includes a dielectric layer and an air gap.

20 Claims, 17 Drawing Sheets

Related U.S. Application Data

(60) Provisional application No. 63/032,366, filed on May 29, 2020.

(51) Int. Cl.
*H01L 21/76* (2006.01)
*H01L 21/762* (2006.01)
*H01L 27/088* (2006.01)
*H01L 29/66* (2006.01)
*H01L 29/78* (2006.01)

(52) U.S. Cl.
CPC ........ *H01L 29/6681* (2013.01); *H01L 29/785* (2013.01); *H01L 2029/7858* (2013.01)

(58) Field of Classification Search
USPC ........................................................ 257/365
See application file for complete search history.

(56) References Cited

U.S. PATENT DOCUMENTS

| | | |
|---|---|---|
| 2015/0287828 A1 | 10/2015 | Zhu et al. |
| 2016/0268392 A1 | 9/2016 | Zhu |
| 2019/0334008 A1 | 10/2019 | Chen et al. |
| 2020/0006559 A1 | 1/2020 | Mehandru et al. |
| 2020/0152736 A1 | 5/2020 | Yu et al. |

\* cited by examiner

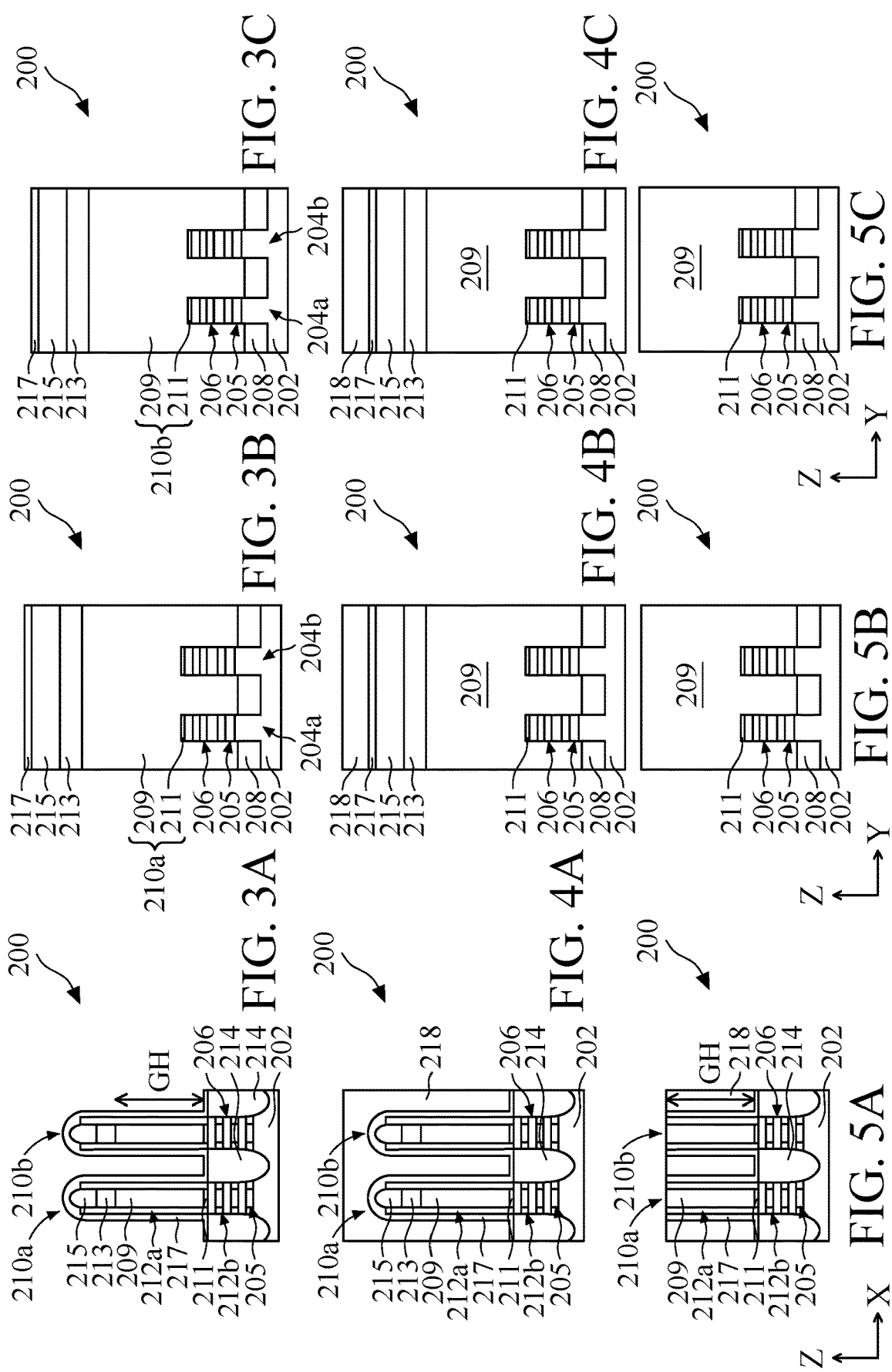

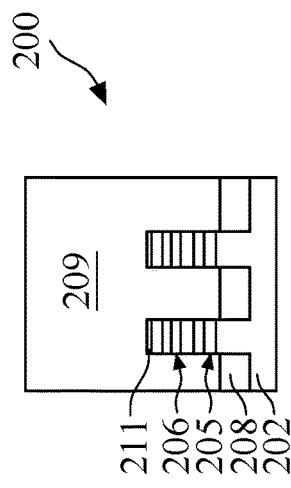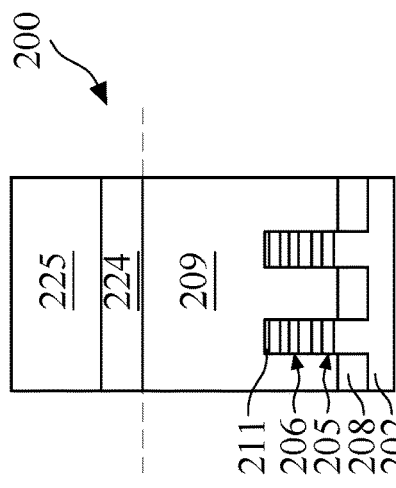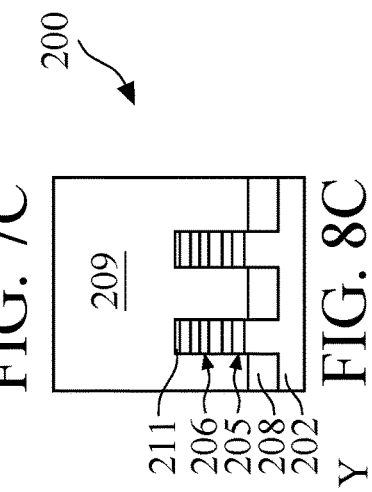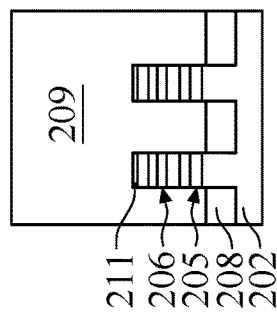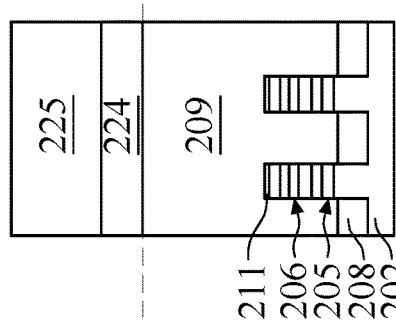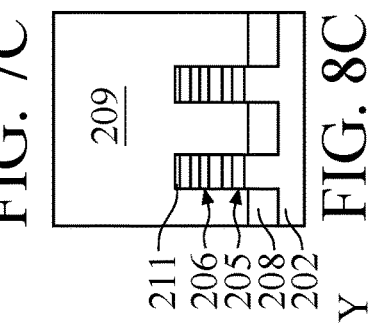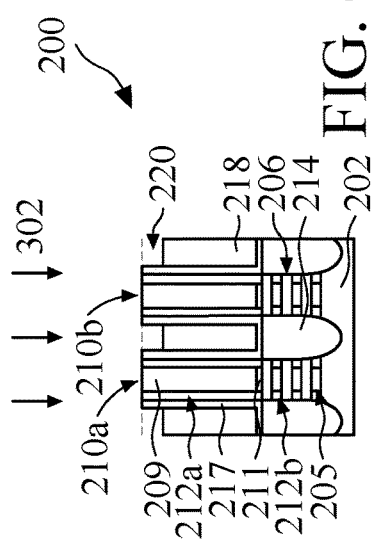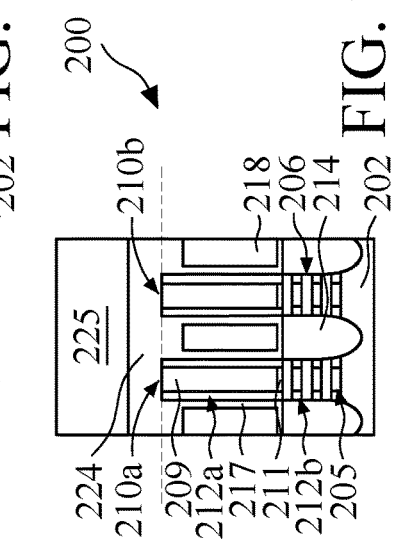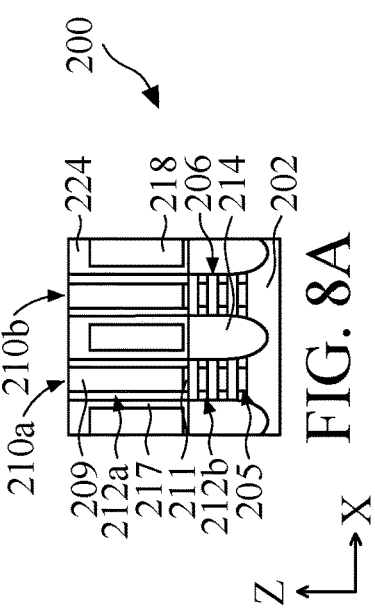

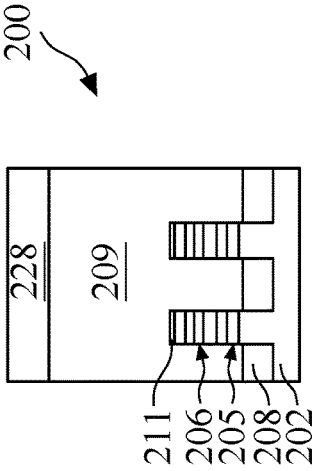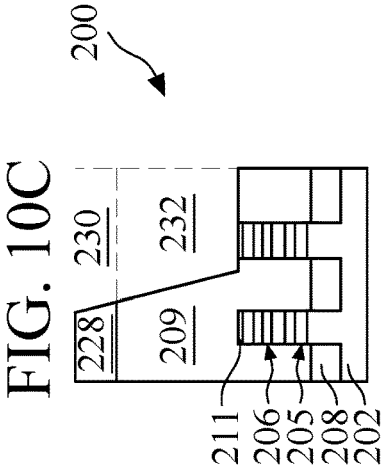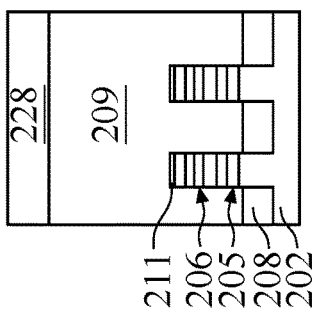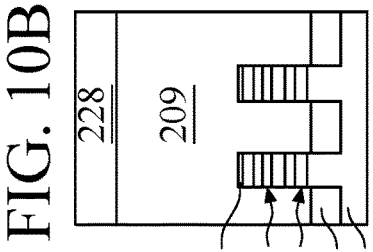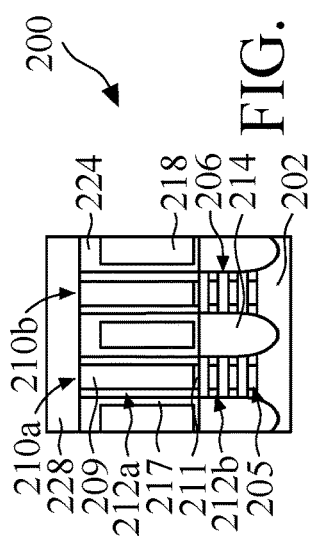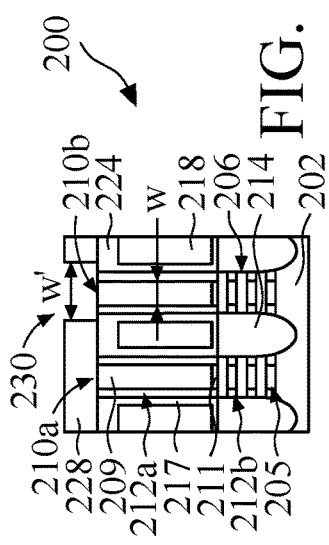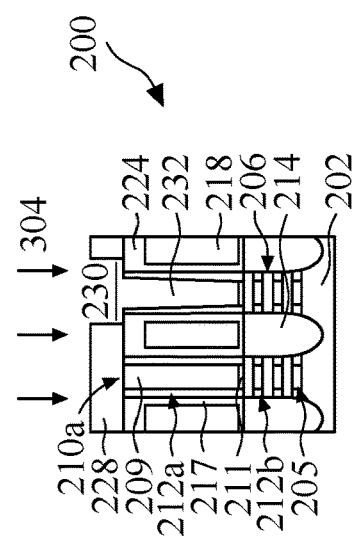

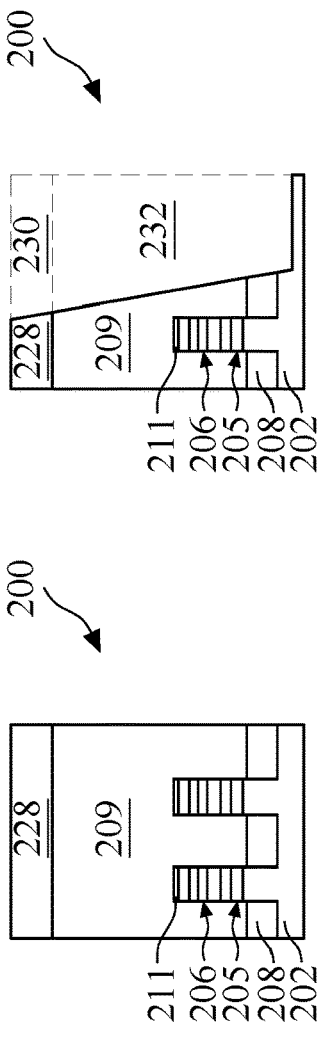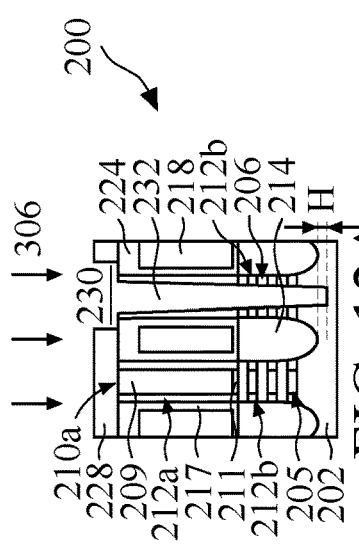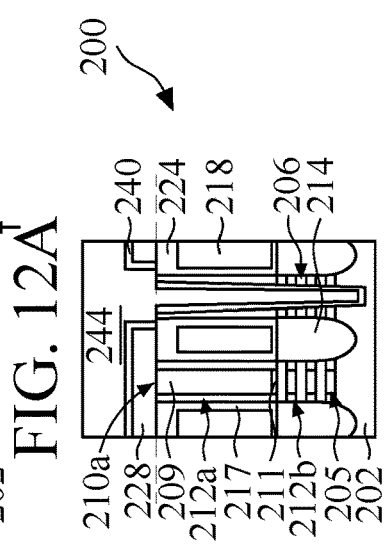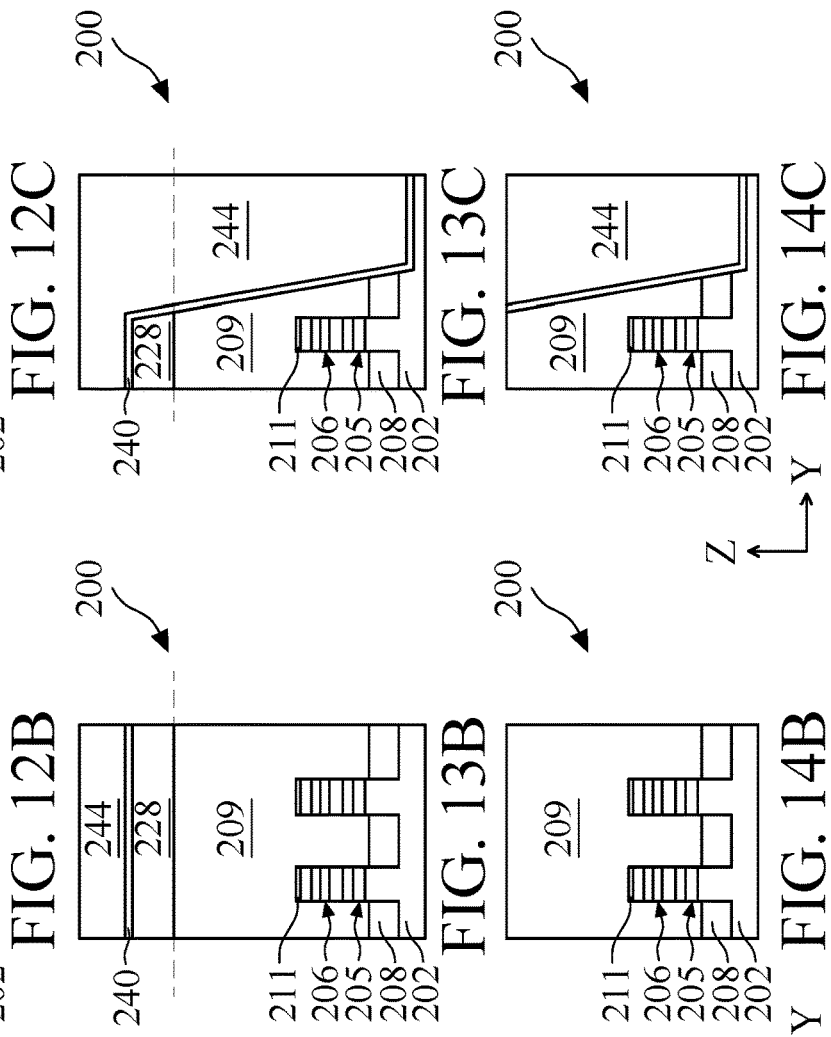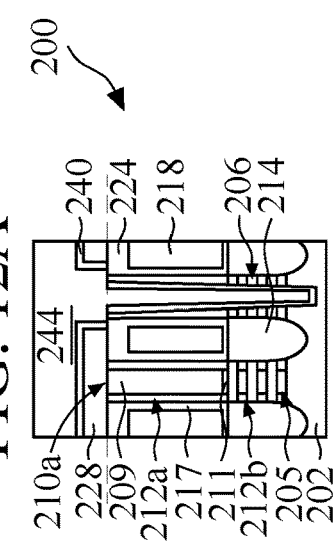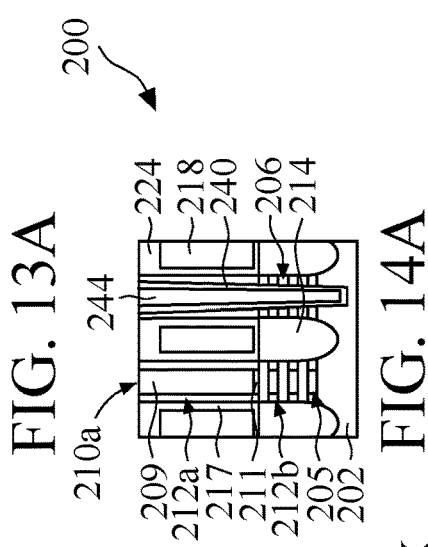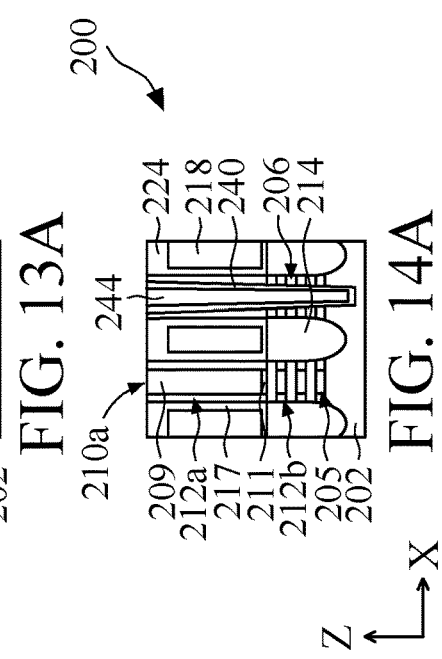

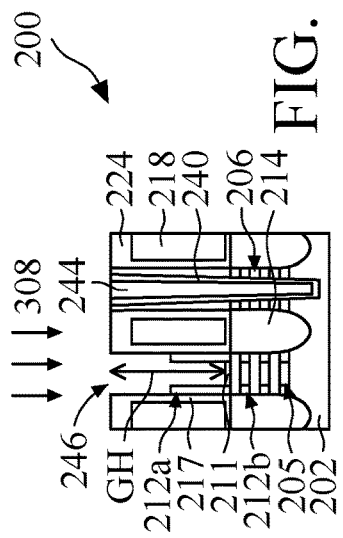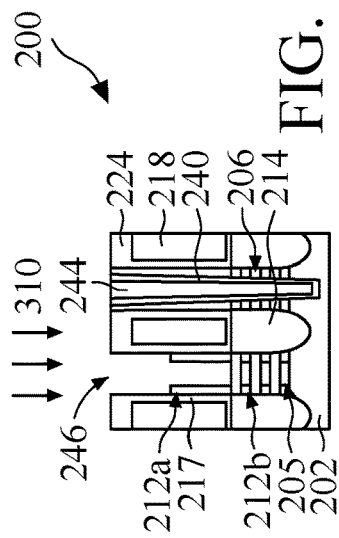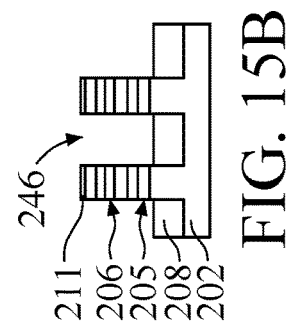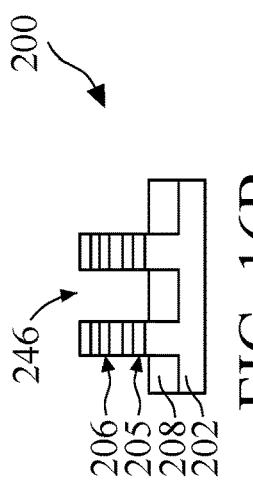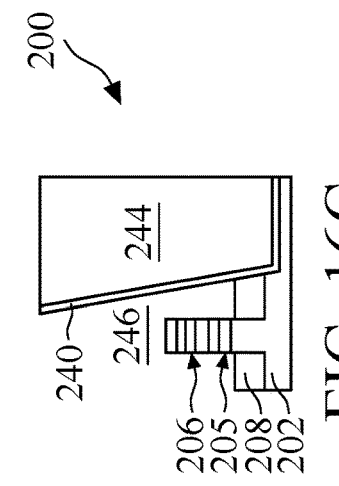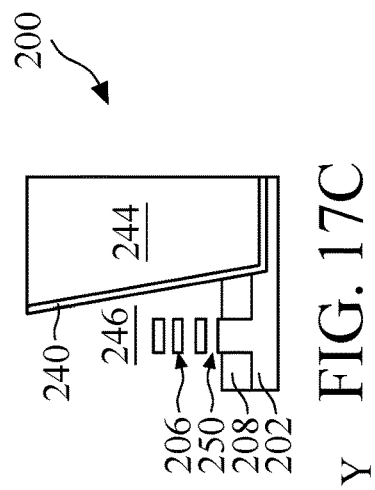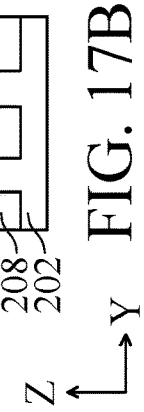

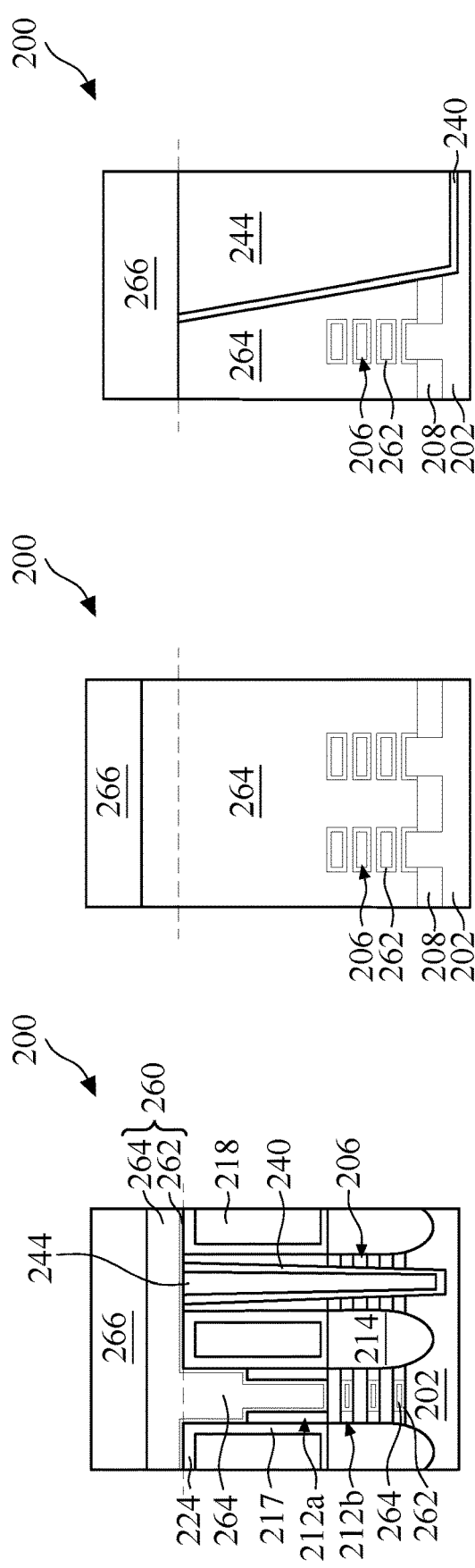
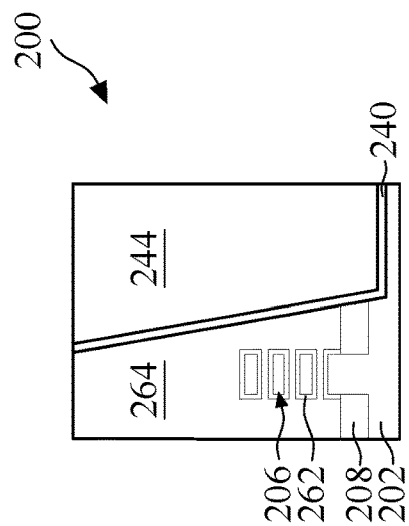
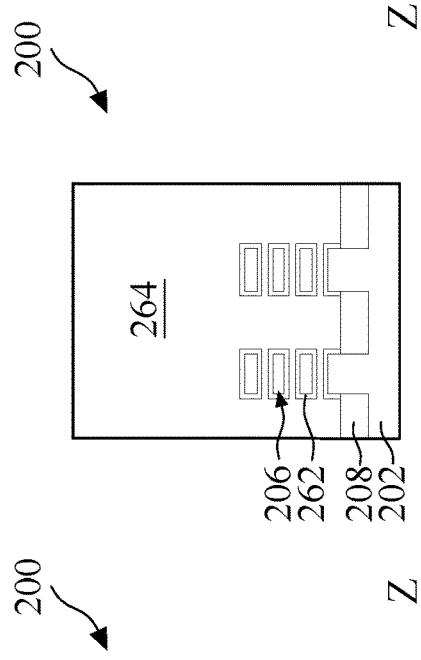
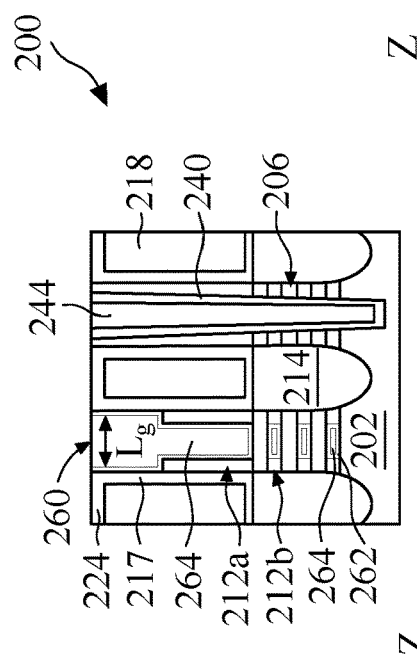

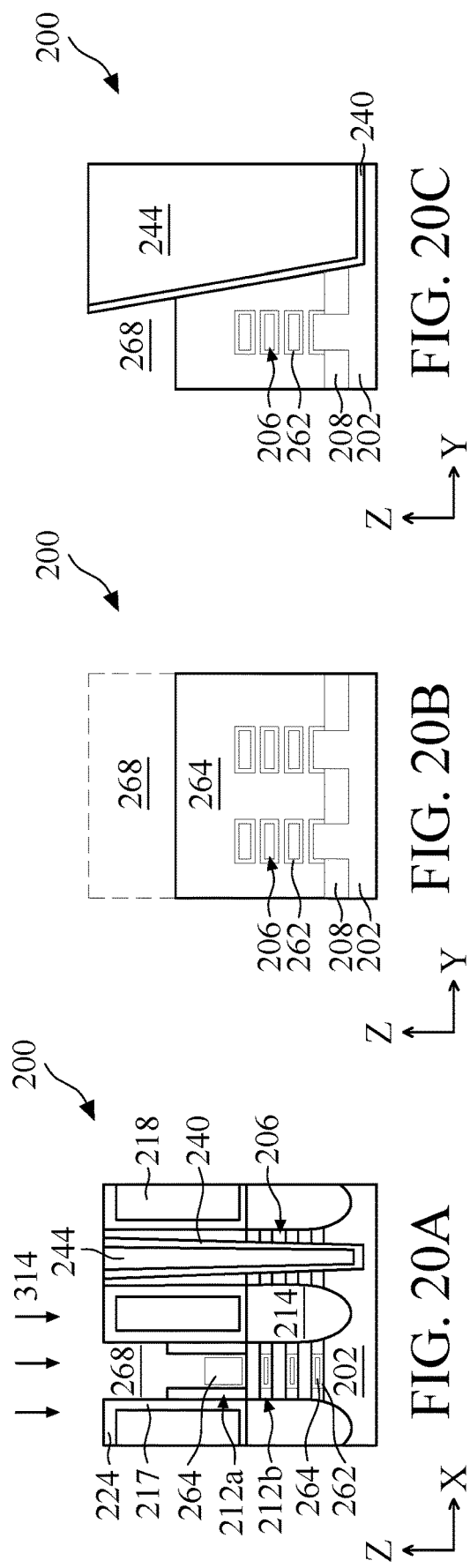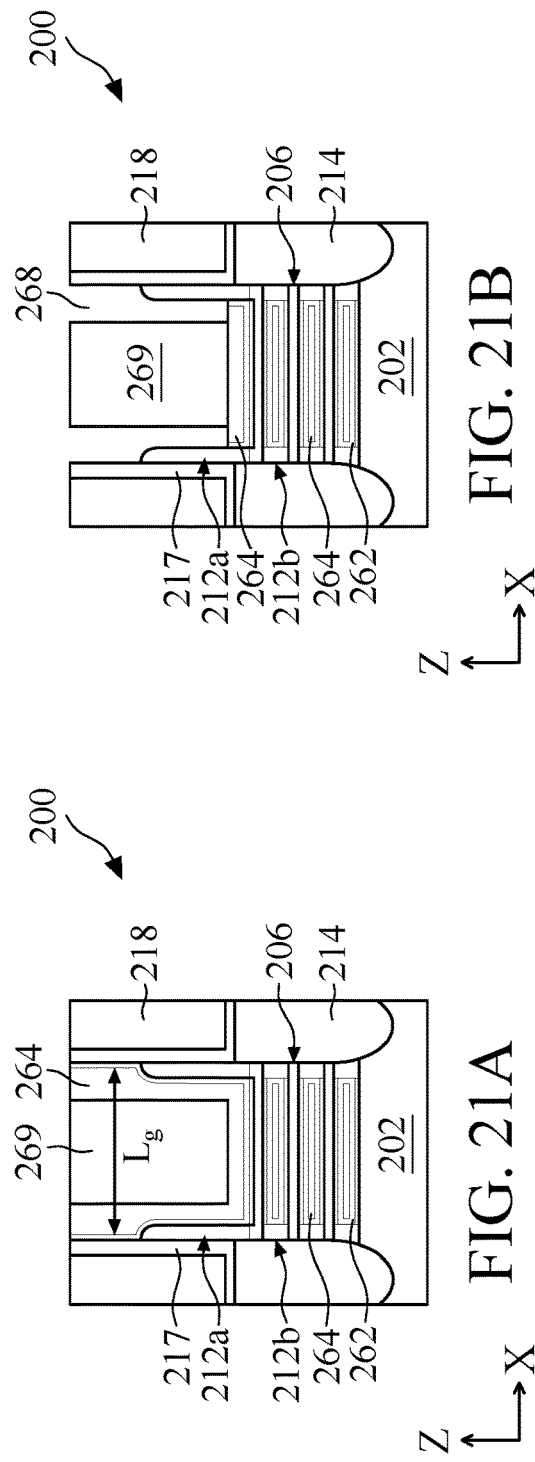

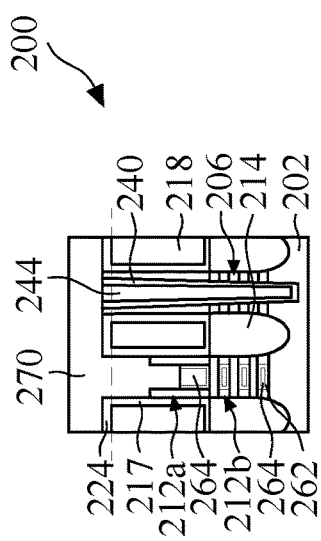
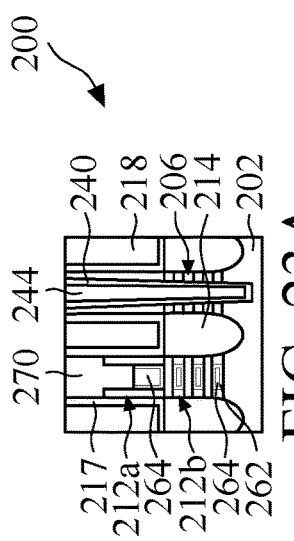
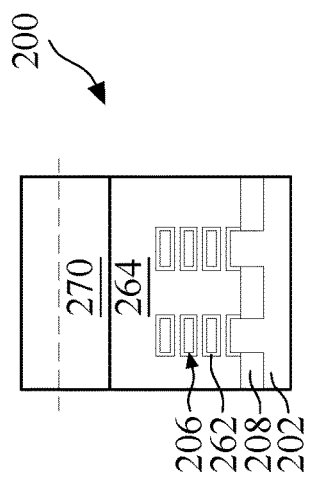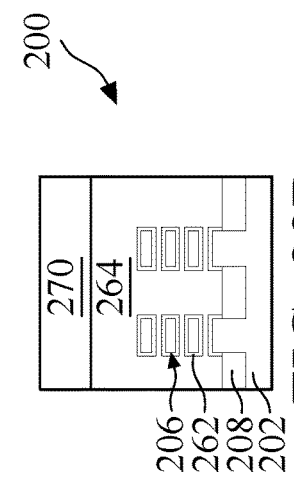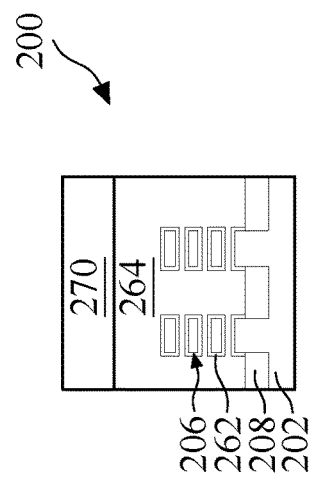
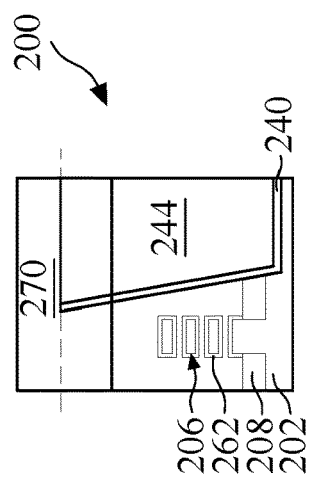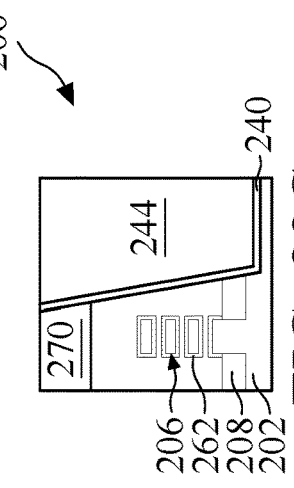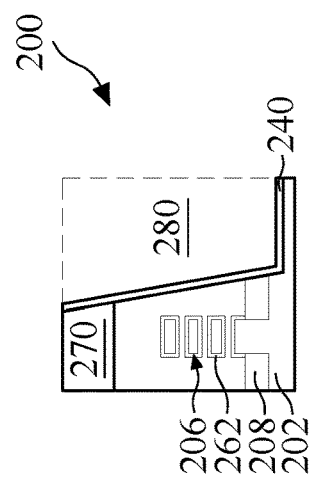

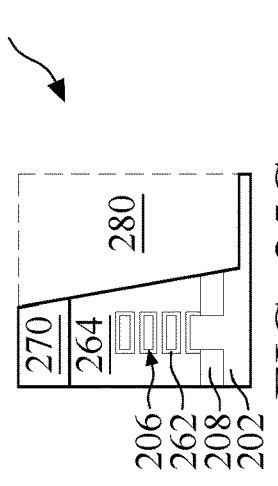
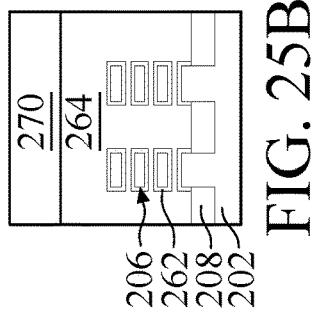
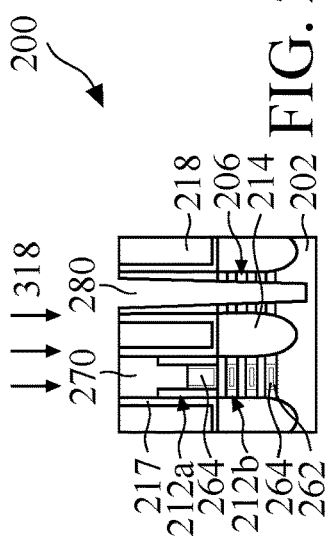
FIG. 25A  FIG. 25B  FIG. 25C
FIG. 26A  FIG. 26B  FIG. 26C
FIG. 27A  FIG. 27B  FIG. 27C

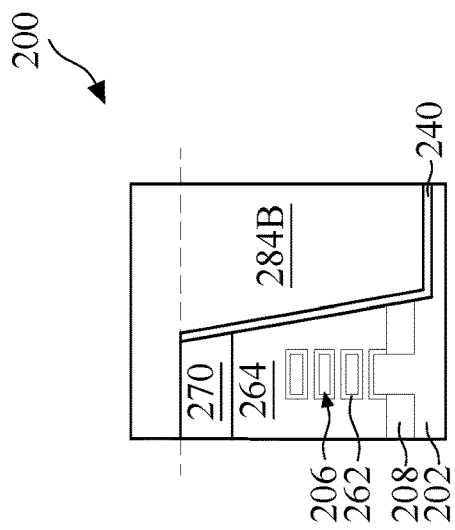
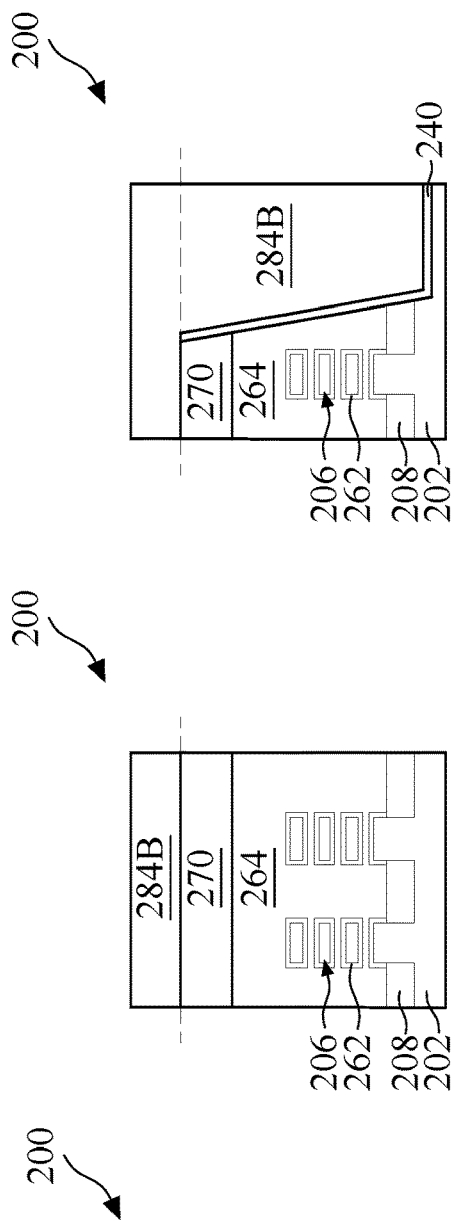
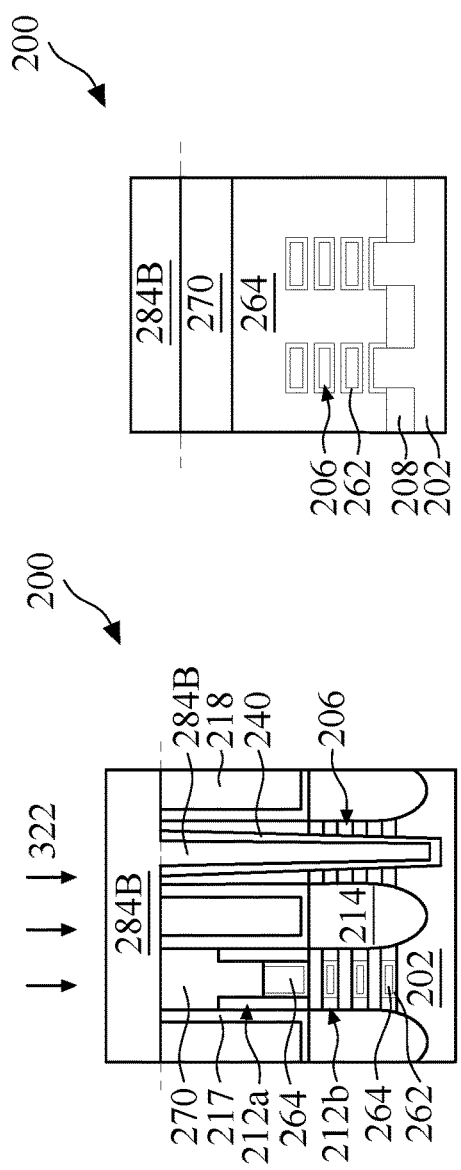
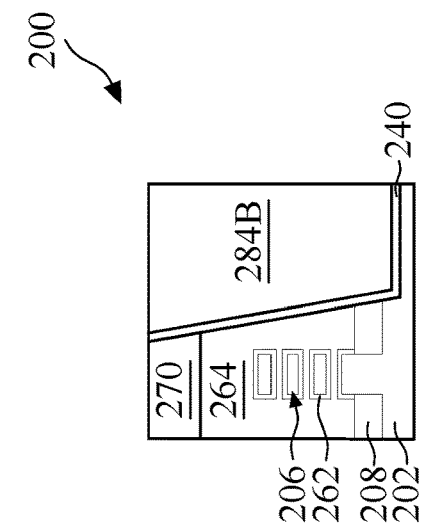
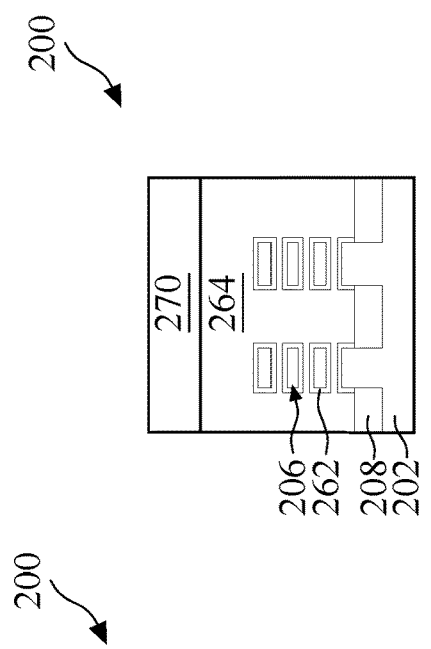
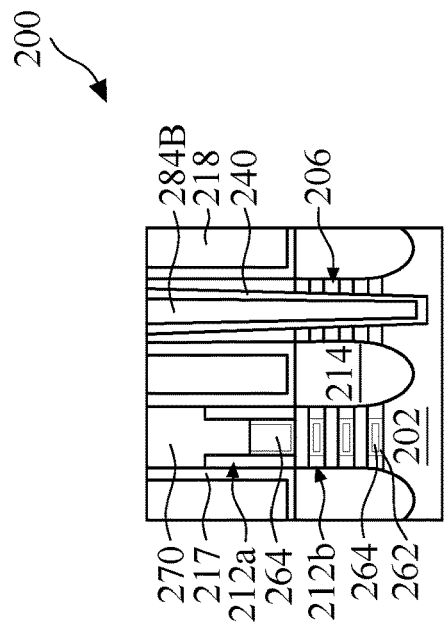
FIG. 28A  FIG. 28B  FIG. 28C
FIG. 29A  FIG. 29B  FIG. 29C

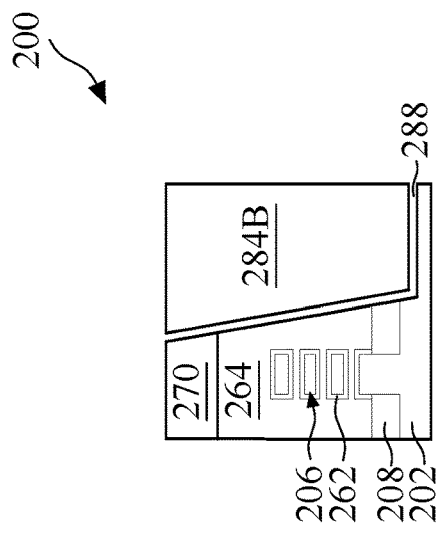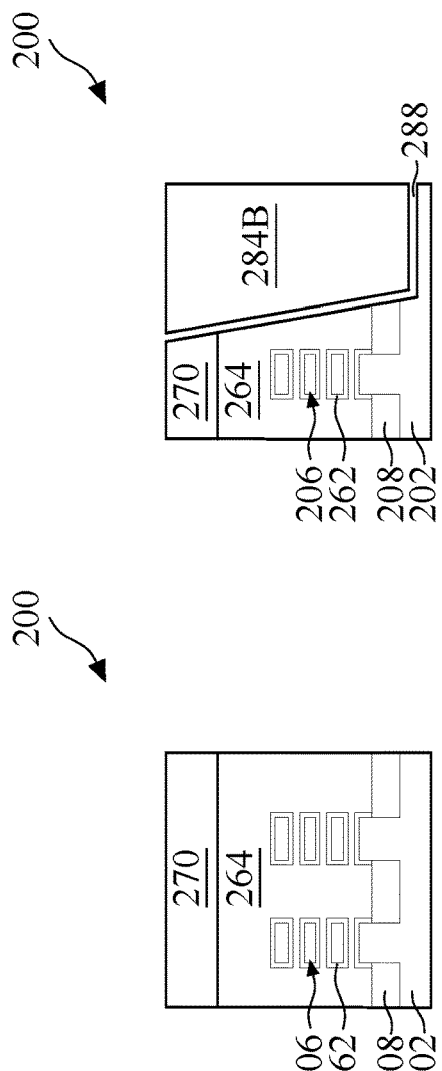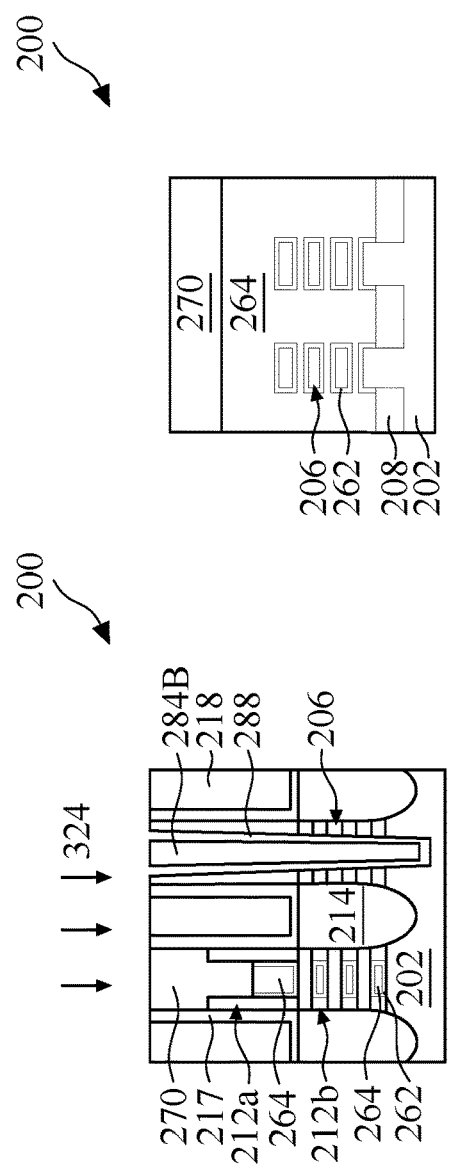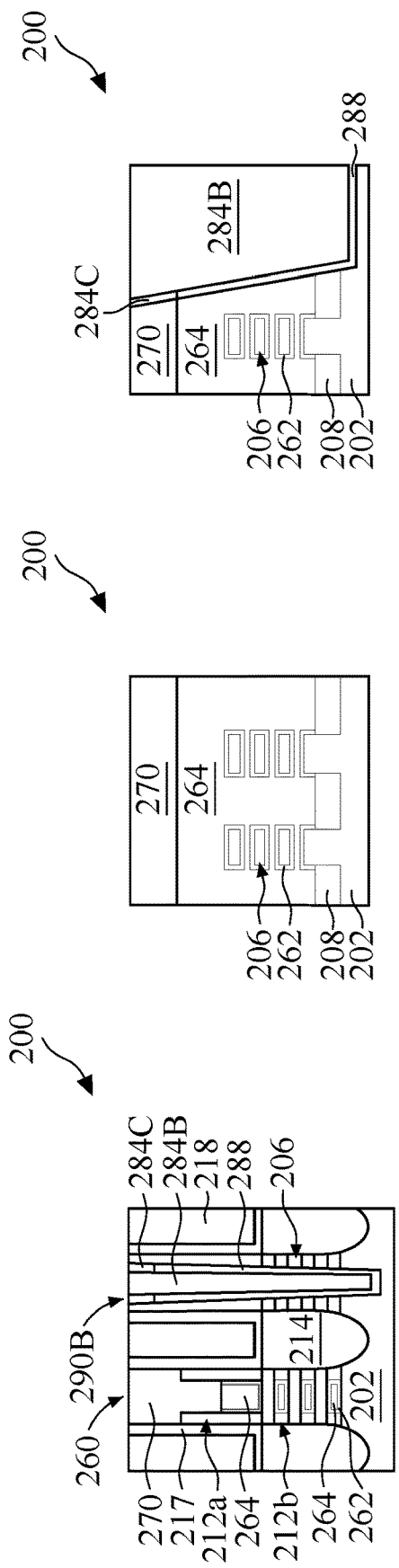

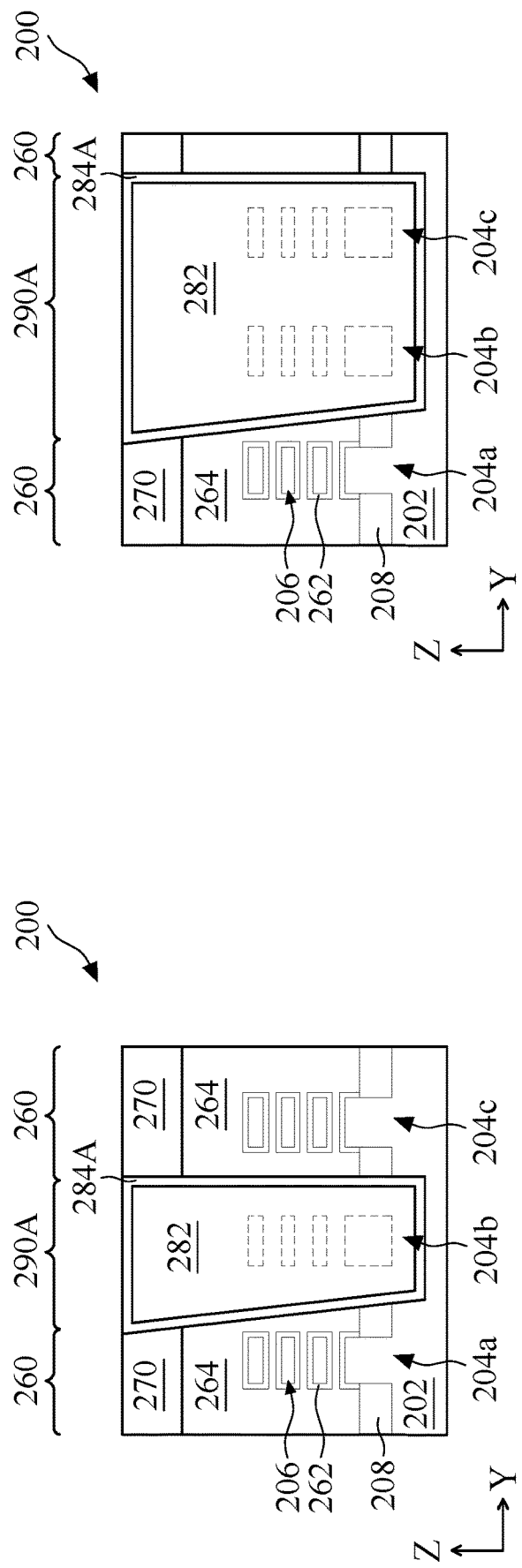
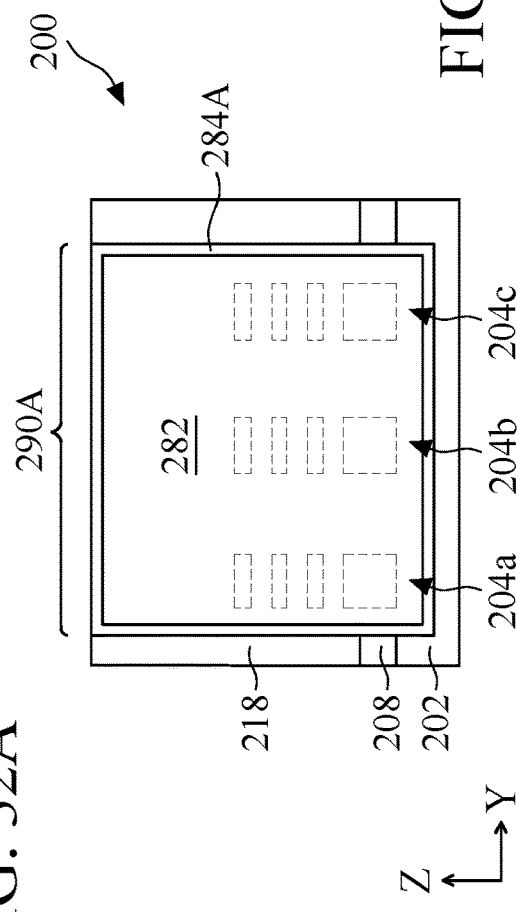
FIG. 32A
FIG. 32B
FIG. 32C

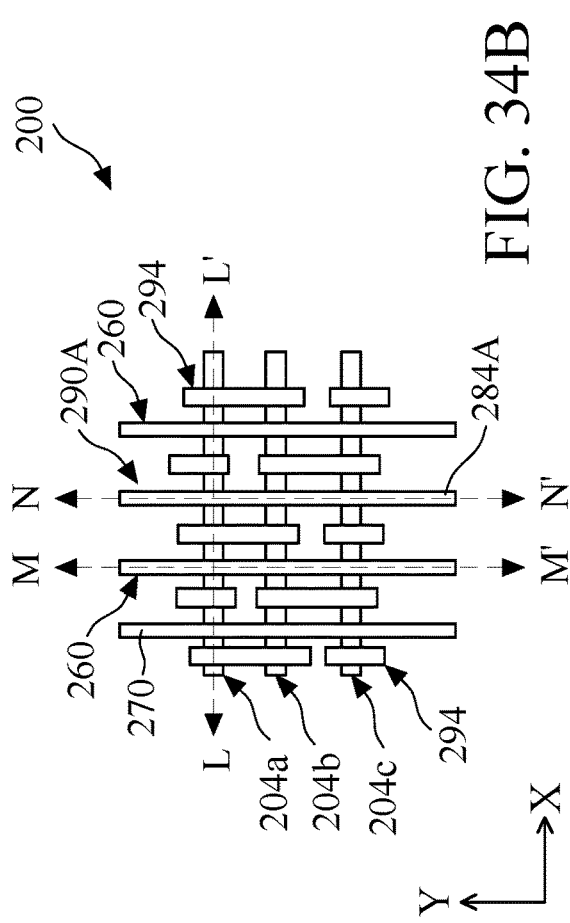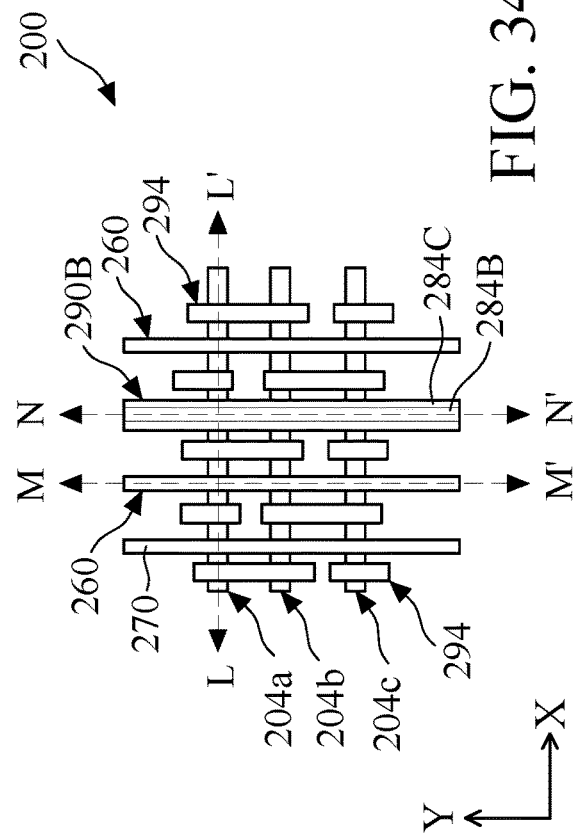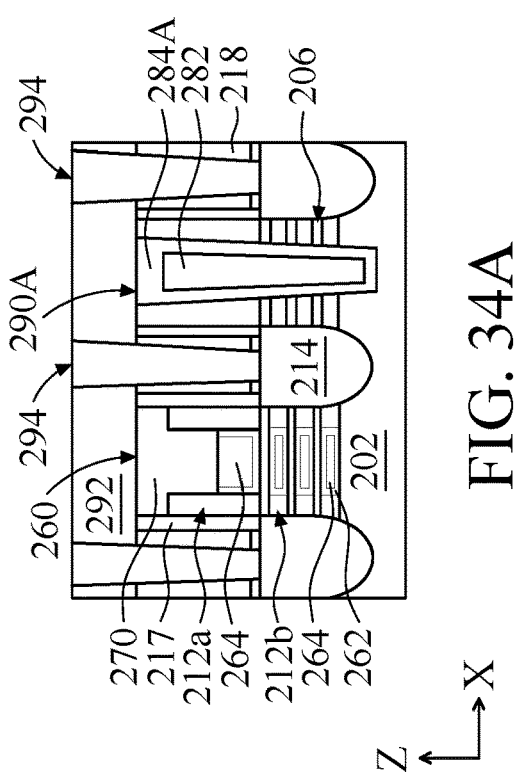

REDUCING PARASITIC CAPACITANCE IN SEMICONDUCTOR DEVICES

CROSS-REFERENCE TO RELATED APPLICATIONS

This is a continuation application of and claims priority to U.S. patent application Ser. No. 17/198,774 filed on Mar. 11, 2021, which claims priority to U.S. Provisional Patent Application Ser. No. 63/032,366, filed May 29, 2020, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, parasitic capacitance of dielectric components disposed between active device regions may have serious bearings on the overall performance of an IC device. In some examples, high parasitic capacitance may lead to lower device speed (e.g., RC delays) when separation distances between the active device regions reduces to meet design requirements of smaller technology nodes. While methods of reducing parasitic capacitance in IC devices have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, 18A, 19A, 20A, 21A, 21B, 22A, 23A, 24A, 25A, 26A, 27A, 28A, 29A, 30A, 31A, 34A, and 34C are cross-sectional views of the semiconductor device taken along line LL' as shown in FIGS. 2A and/or 2B during intermediate stages of the method shown in FIGS. 1A and 1B according to various embodiments of the present disclosure.

FIGS. 3B, 4B, 5B, 6B, 7B, 8B, 9B, 10B, 11B, 12B, 13B, 14B, 15B, 16B, 17B, 18B, 19B, 20B, 22B, 23B, 24B, 25B, 26B, 27B, 28B, 29B, 30B, and 31B are cross-sectional views of the semiconductor device taken along line MM' as shown in FIGS. 2A and/or 2B during intermediate stages of the method shown in FIGS. 1A and 1B according to various embodiments of the present disclosure.

FIGS. 3C, 4C, 5C, 6C, 7C, 8C, 9C, 10C, 11C, 12C, 13C, 14C, 15C, 16C, 17C, 18C, 19C, 20C, 22C, 23C, 24C, 25C, 26C, 27C, 28C, 29C, 30C, 31C, 32A, 32B, 32C, 33A, 33B, and 33C are cross-sectional views of the semiconductor device taken along line NN' as shown in FIGS. 2A and/or 2B during intermediate stages of the method shown in FIGS. 1A and 1B according to various embodiments of the present disclosure.

FIG. 34B is a planar top view of the semiconductor device shown in FIG. 34A according to various embodiments of the present disclosure.

FIG. 34D is a planar top view of the semiconductor device shown in FIG. 34C according to various embodiments of the present disclosure.

DETAILED DESCRIPTION

Figure 1A:
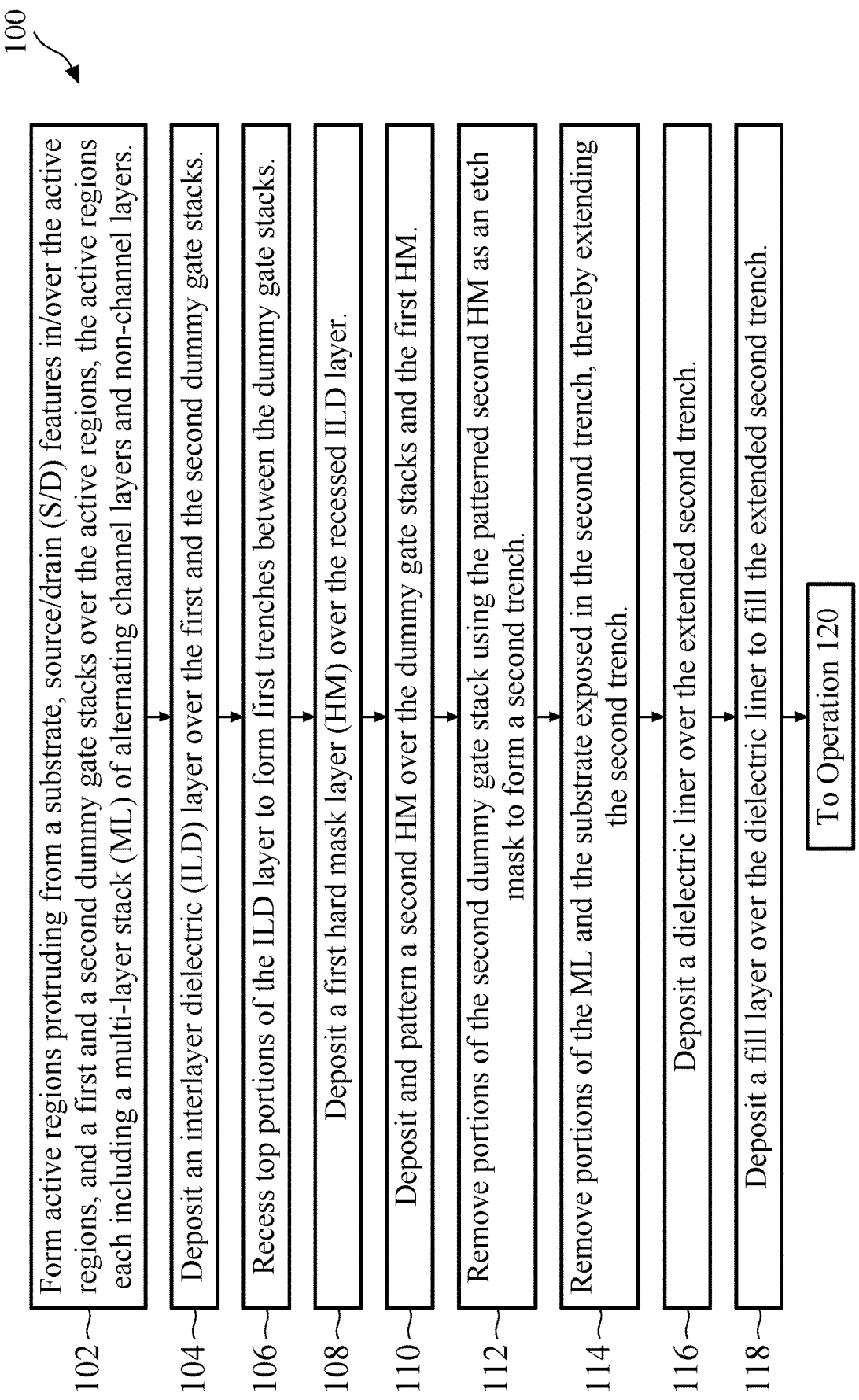
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA, FETs), in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. The present disclosure includes multiple embodiments. Different embodiments may have different advantages, and no particular advantage is necessarily required of any embodiment.

Figure 1B:
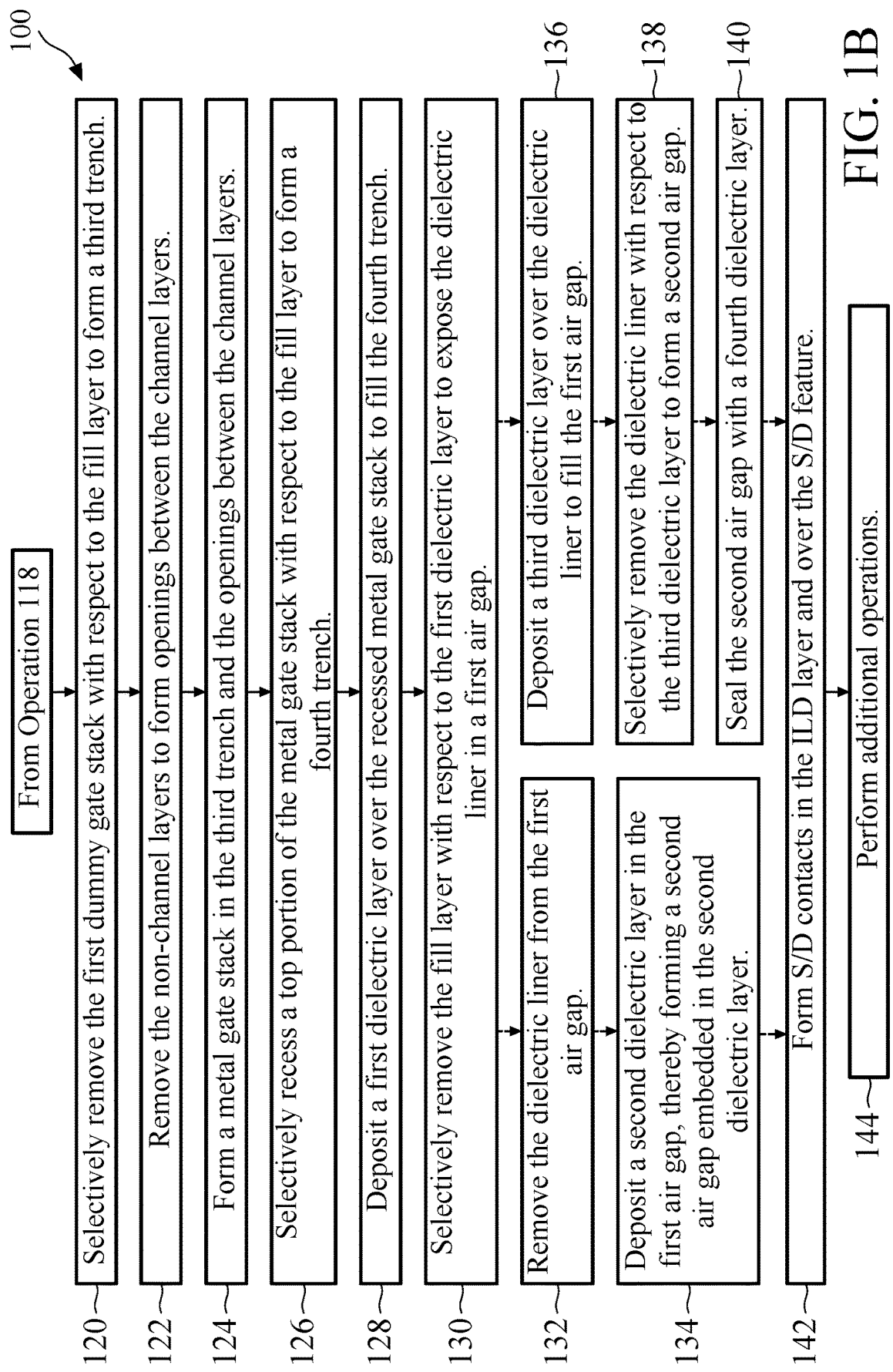
Figures 2A, 2B:
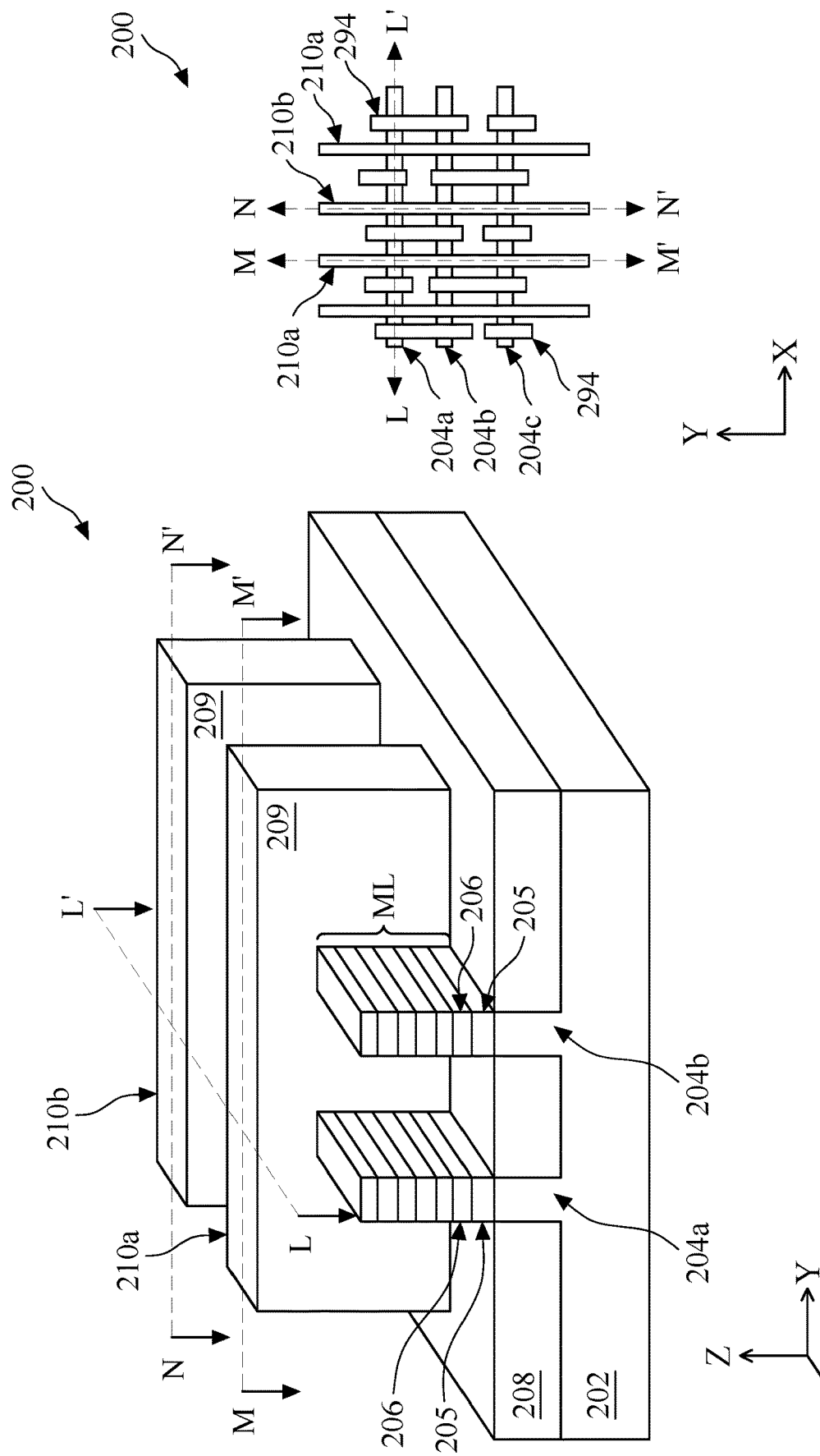
FIG. 2A is a three-dimensional perspective view of a portion of an example semiconductor device according to various embodiments of the present disclosure.
FIG. 2B is a planar top view of the semiconductor device shown in FIG. 2A according to various embodiments of the present disclosure.
Figure 33A:
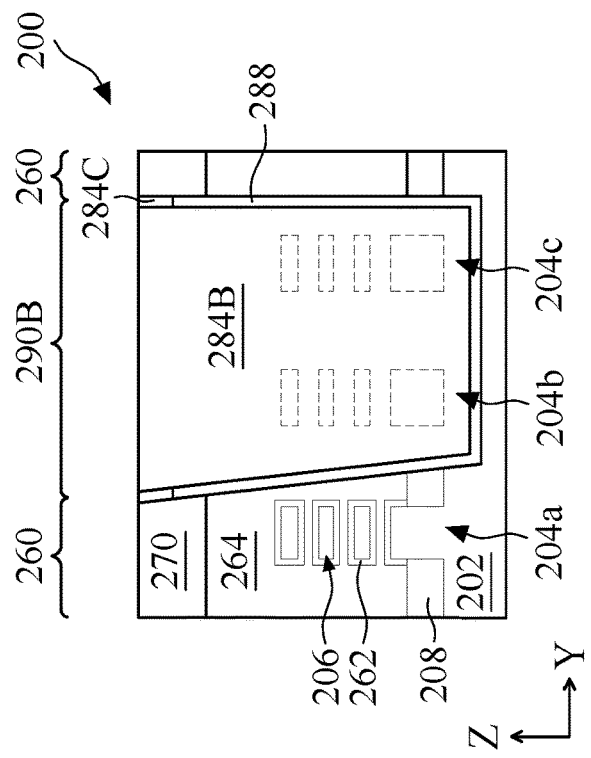
Figure 33B:
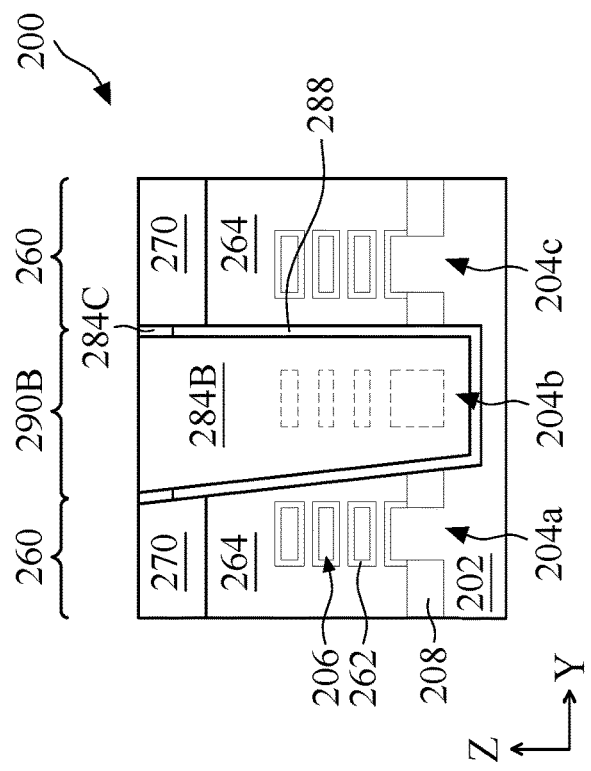
Figure 33C:
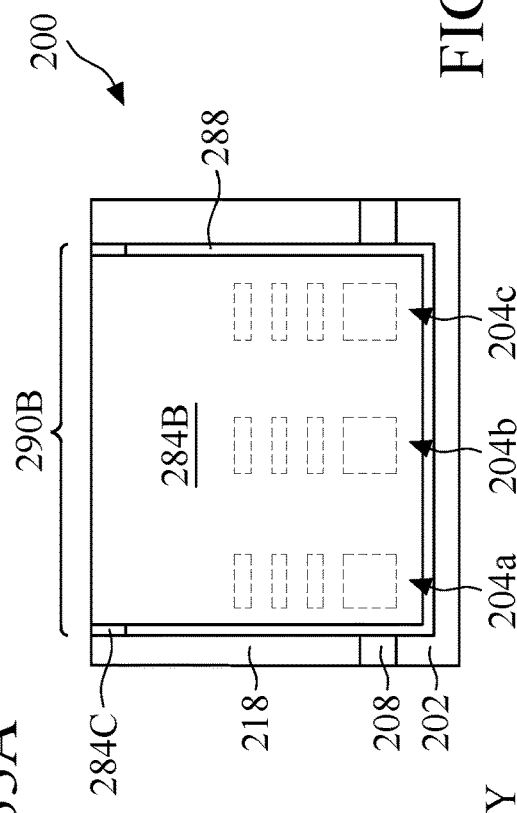

Referring now to FIGS. 1A and 1B collectively, a flowchart of a method 100 of forming a semiconductor device 200 (hereafter simply referred to as the device 200) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 3A-33C, which are various cross-sectional views of the device 200 as shown in FIGS. 2A and 2B at intermediate steps of method 100. For examples, FIGS. 3A, 4A, 5A, 6A, 7A, 8A, 9A, 10A, 11A, 12A, 13A, 14A, 15A, 16A, 17A, 18A, 19A, 20A, 21A, 21B, 22A, 23A, 24A, 25A, 26A, 27A, 28A, 29A, 30A, 31A, 34A, and 34C are cross-sectional views of the device 200 taken along line LL' as shown in FIGS. 2A and/or 2B; FIGS. 3B, 4B, 5B, 6B, 7B, 8B, 9B, 10B, 11B, 12B, 13B, 14B, 15B, 16B, 17B, 18B, 19B, 20B, 22B, 23B, 24B, 25B, 26B, 27B, 28B, 29B, 30B, and 31B are cross-sectional views of the device 200 taken along line MM' as shown in FIGS. 2A and/or 2B; FIGS. 3C, 4C, 5C, 6C, 7C, 8C, 9C, 10C, 11C, 12C, 13C, 14C, 15C, 16C, 17C, 18C, 19C, 20C, 22C, 23C, 24C, 25C, 26C, 27C, 28C, 29C, 30C, 31C, 32A, 32B, 32C, 33A, 33B, and 33C are cross-sectional views of the device 200 taken along line NN' as shown in FIGS. 2A and/or 2B; and FIGS. 34B and 34D are planar top views corresponding to FIGS. 34A and 34C, respectively.

The device 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the device 200 includes one or more NS FETs. The present disclosure is not limited to any particular number of devices or device regions, or to any particular device configurations. Additional features can be added to the device 200, and some of the features described below can be replaced, modified, or eliminated in other embodiments of the device 200.

At operation 102, referring to FIGS. 2A-3C, method 100 forms the device 200 that includes multiple active three-dimensional device regions (hereafter referred to as fins) 204a, 204b, and 204c protruding from a semiconductor substrate (hereafter referred to as the substrate) 202, where the fins 204a-204c are separated by isolation features 208. The device 200 further includes epitaxial source/drain (S/D) features 214 (see, for example, FIG. 3A) disposed in and/or over S/D regions of the fins 204a-204c and at least two dummy gate stacks (or placeholder gate stacks), 210a and 210b, oriented lengthwise substantially perpendicular to the fins 204a-204c and interposing between the epitaxial S/D features 214 of each fin 204a-204c. In some embodiments, referring to FIG. 2B, the dummy gate stack 210b is disposed between two dummy gate stacks 210a.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In the present embodiments, referring to FIGS. 2A and 3A, each fin 204a-204c includes a multi-layer structure ML of alternating non-channel layers (or sacrificial layers) 205 and channel layers 206 stacked vertically over protruding portions of the substrate 202. In the present embodiments, each non-channel layer 205 is a sacrificial layer configured to be removed at a subsequent processing step, thereby providing openings between the channel layers 206 for forming metal gate stacks therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each fin 204a-204c may include a total of three to ten pairs of alternating non-channel layers 205 and channel layers 206; of course, other configurations may also be applicable depending upon specific design requirements. In alternative embodiments, the fins 204a-204c are configured with uniform composition along the Z axis and free of the ML structure as depicted herein.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET.

In the present embodiments, the fins 204a-204c are fabricated from the ML using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving three-dimensional fins 204a-204c protruding the substrate 202. The etching process may include dry etching, wet etching, reactive ion etching (RIE), other suitable processes, or combinations thereof. The patterned masking element is subsequently removed from the ML using any suitable process, such as ashing and/or resist stripping.

The isolation features 208 may include silicon oxide (SiO and/or $SiO_2$), fluoride-doped silicate glass (FSG), a low-k dielectric material, other suitable materials, or combinations thereof. The isolation features 208 may include shallow trench isolation (STI) features. In one embodiment, the isolation features 208 are formed by filling trenches that separate the fins 204a-204c with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing, or CMP, process and selectively etched back to form the isolation features 208. The isolation features 208 may include a single-layer structure or a multi-layer structure.

Still referring to FIGS. 2A-3C, the device 200 further includes a dummy gate stack 210a and a dummy gate stack 210b oriented substantially parallel to each other along the Y axis and disposed over channel regions of the fins 204a-204c. In the present embodiments, each dummy gate stacks 210a and 210b includes a dummy gate electrode 209 disposed over an interfacial layer (IL) 211, which may include an oxide material (e.g., silicon oxide). According to embodiments of the present disclosure, the dummy gate stacks 210a and 210b have substantially the same composition and are formed to substantially the same gate height GH, which is measured from the IL 211 to a top surface of the dummy gate stacks 210a and 210b. As discussed in detail below, portions of the dummy gate stack 210a are configured to be replaced with a metal gate structure, while at least a portion of the dummy gate stack 210b is replaced with an insulating (or dielectric) structure. Such insulating structure may alternatively be referred to as a Continuous Poly on Diffusion Edge, or CPODE, structure. In at least some existing implementations, CPODE structures may be used as a scaling tool to improve density of devices in advanced technology nodes. In one such example, a CPODE structure replacing the dummy gate stack 210b may be configured to provide isolation between neighboring FETs (i.e., between active device regions), which include epitaxial S/D features and conductive gate structures formed in place of the dummy gate stacks 210a. As provided herein, the dummy gate stack 210b may be partially or entirely replaced with a CPODE structure according to specific design requirements.

Generally, parasitic capacitance of dielectric components disposed between active device regions plays an important role in boosting device performance. RC delay resulting in lower processing speed may occur with higher parasitic capacitance brought about by dielectric components with higher k values (dielectric constants). The present embodiments are directed to methods of forming a CPODE with lowered k values to reduce parasitic capacitance between two active device regions. In some embodiments, the active device regions include multi-gate transistors, such as NS FETs.

The dummy gate stacks 210a and 210b may be formed by a series of deposition and patterning processes. For example, the dummy gate stacks 210a and 210b may be formed by depositing a polysilicon (poly-Si) layer over the fins 204a-204c and patterning the poly-Si layer with a series of photolithography and etching processes (e.g., an anisotropic dry etching process) to form the dummy gate electrode 209.

To accommodate the patterning process and protect the dummy gate stack 210b during subsequent fabrication processes, hard mask layers (HMs) 213 and 215 are deposited over the poly-Si layer as depicted in FIGS. 3A-3C. The hard mask layers 213 and 215 generally have different compositions and may each include silicon oxide (SiO and/or $SiO_2$), silicon nitride (SiN), silicon carbide (SiC), oxygen-containing silicon nitride (SiON), oxygen-containing silicon carbide (SiOC), carbon-containing silicon nitride (SiCN), other suitable materials, or combinations thereof. In some examples, such as depicted herein, the HM 213 may include SiN and the HM 215 may include silicon oxide. In the present embodiments, the IL 211 is formed over the fins 204a-204c before depositing the polysilicon layer by a suitable method, such as thermal oxidation, chemical oxidation, other suitable methods, or combinations thereof.

Referring to FIG. 3A, the device 200 further includes top gate spacers 212a disposed on sidewalls of the dummy gate stacks 210a and 210b. The top gate spacers 212a may be a single-layer structure or a multi-layer structure and may include silicon oxide, SiN, SiC, SiON, SiOC, SiCN, other suitable materials, or combinations thereof. Each spacer layer of the top gate spacers 212a may be formed by first depositing a dielectric layer over the dummy gate stacks 210a and 210b by a suitable deposition method (e.g., CVD and/or atomic layer deposition (ALD)) and subsequently removing portions of the dielectric layer in an anisotropic (e.g., directional) etching process (e.g., a dry etching process), leaving the top gate spacers 212a on the sidewalls of the dummy gate stacks 210a and 210b. In some instances, the anisotropic etching process may inadvertently remove portions of the HM 215, resulting in it having a rounded profile as depicted herein. Still referring to FIG. 3A, the device 200 further includes an etch-stop layer (ESL) 217 disposed over the dummy gate stacks 210a and 210b, as well as the top gate spacers 212a, and configured to protect the various underlying components during subsequent fabrication processes. The ESL 217 may include any suitable dielectric material, such as SiN, SiCN, other suitable materials, or combinations thereof, and may be formed by CVD, ALD, physical vapor deposition (PVD), other suitable methods, or combinations thereof. In the present embodiments, the ESL 217 provides etching selectivity with respect to its surrounding dielectric components, such as the HM 215, to ensure protection against inadvertent damage to these components.

Still referring to FIG. 3A, the device 200 further includes inner gate spacers 212b disposed between the epitaxial S/D features 214 and the non-channel layers 205. The inner gate spacers 212b may be a single-layer structure or a multi-layer structure and may include silicon oxide, SiN, SiCN, SiOC, SiON, SiOCN, Si, a low-k dielectric material, tetraethylorthosilicate (TEOS), doped silicon oxide (e.g., borophosphosilicate glass (BPSG), FSG, phosphosilicate glass (PSG), boron-doped silicate glass (BSG), etc.), air, other suitable dielectric material, or combination thereof. In some embodiments, the inner gate spacers 212b have a composition different from that of the top gate spacers 212a.

Forming the inner gate spacers 212b (and subsequently the epitaxial S/D features 214) includes first forming S/D recesses (not depicted) in the S/D regions of the fins 204a-204c. In the present embodiments, method 100 implements an etching process that selectively removes portions of the fins 204a-204c in the S/D regions without removing, or substantially removing, the dummy gate stack 210a, the dummy gate stack 210b, or the isolation features 208. In some embodiments, the etching process is a dry etching process employing a suitable etchant capable of removing Si (i.e., the channel layers 206) and SiGe (i.e., the non-channel layers 205) of the ML. In some non-limiting examples, the dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

Subsequently, method 100 forms the inner gate spacers 212b in a series of etching and deposition processes. For example, forming the inner gate spacers 212b may begin with selectively removing portions of the non-channel layers 205 without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206 exposed in the S/D recesses, thereby forming the inner gate spacers 212b as depicted in FIG. 3A. The one or more dielectric layers may be deposited by any suitable method, such as ALD, CVD, PVD, other suitable methods, or combinations thereof.

Each of the epitaxial S/D features 214 may be suitable for forming a p-type FET device (i.e., including a p-type epitaxial material) or alternatively, an n-type FET device (i.e., including an n-type epitaxial material). The p-type epitaxial material may include one or more epitaxial layers of silicon germanium (epi SiGe), where the silicon germanium is doped with a p-type dopant such as boron, germanium, indium, other p-type dopants, or combinations thereof. The n-type epitaxial material may include one or more epitaxial layers of silicon (epi Si) or silicon carbon (epi SiC), where the silicon or silicon carbon is doped with an n-type dopant such as arsenic, phosphorus, other n-type dopants, or combinations thereof. In some embodiments, one or more epitaxy growth processes are performed to grow an epitaxial material in each S/D recess and over the inner gate spacers 212b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 214.

Now referring to FIGS. 4A-4C, method 100 at operation 104 forms an interlayer dielectric (ILD) layer 218 over the ESL 217, thereby filling space between the dummy gate stacks 210a and 210b. The ILD layer 218 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Referring to FIGS. 5A-5C, method 100 at operation 104 subsequently performs one or more CMP process to planarize the top surface of the device 200. In the present embodiments, planarizing the device 200 removes the HMs 213 and 215 from the dummy gate stacks 210a and 210b, while maintaining the gate height GH of the dummy gate stacks 210a and 210b.

Referring to FIGS. 6A-6C, method 100 at operation 106 removes top portions of the ILD layer 218 to form trenches 220 between the dummy gate stacks 210a and 210b. Method 100 implements a suitable etching process 302 to selectively remove the top portions of the ILD layer 218 without removing, or substantially removing, the dummy gate stack 210a, the dummy gate stack 210b, the ESL 217, or the top gate spacers 212a. The etching process 302 may be a dry etching process, a wet etching process, an RIE process, other suitable processes, or combinations thereof.

Referring to FIGS. 7A-8C, method 100 at operation 108 deposits a HM 224 over the recessed ILD layer 218, thereby filling the trenches 220. The HM 224 may include silicon oxide, SiN, SiCN, SiOC, SiON, SiOCN, other suitable materials, or combinations thereof, and may be formed by CVD, ALD, PVD, other suitable methods, or combinations thereof. In the present embodiments, the HM 224 includes SiN and is deposited by an ALD process. Subsequently, method 100 at operation 108 implements one or more CMP process to planarize the HM 224 with the top surface of the dummy gate stacks 210a and 210b. In the depicted embodiments, method 100 first forms an oxide layer 225 on the HM 224 before implementing the one or more CMP process along the dotted line as depicted in FIG. 7A. In some embodiments, the oxide layer 225 is configured to provide uniform polishing across surface of the device 200. The resulting device 200 depicted in FIGS. 8A-8C, includes the HM 224 disposed between but not over the top surface of the dummy gate stacks 210a and 210b.

Now referring to FIGS. 9A-10C, method 100 at operation 110 deposits a HM 228 over the device 200, and subsequently patterns the HM 228 to form an opening 230 configured to selectively expose at least portions of the dummy gate stack 210b. The HM 228 may include silicon oxide, SiN, SiCN, SiOC, SiON, SiOCN, Si, other suitable materials, or combinations thereof, and may be formed by CVD, ALD, PVD, other suitable methods, or combinations thereof. In the present embodiments, the HM 228 and the HM 224 include substantially the same composition such as, for example, SiN. Method 100 may pattern the HM 228 using a series of photolithography and etching processes similar to those discussed above with respect to forming the fins 204a-204c. For example, a masking element (not depicted) including a photoresist layer may be formed over the HM 228, exposed to a radiation source through a patterned mask, and subsequently developed to form a patterned masking element. The HM 228 may then be etched using the patterned masking element as an etch mask to form the opening 230 that exposes the dummy gate stack 210b but not the dummy gate stack 210a. In some embodiments, the opening 230 spans a width w' along the X axis that is greater than a distance w between the top gate spacers 212a.

In some embodiments, as depicted in FIGS. 10A-10C, the opening 230 partially exposes portions of the dummy gate stack 210b disposed over the fin 204b but not the portions disposed over the fin 204a. While not depicted herein, some embodiments of the present disclosure provide that the HM 228 is patterned to expose the dummy gate stack 210b in its entirely along the Y axis, i.e., the opening 230 exposes all of the fins over which the dummy gate stack 210b is disposed. Accordingly, the dimension of the opening 230 along the Y axis corresponds to the dimension of the CPODE to be formed in place of the dummy gate stack 210b.

Subsequently, referring to FIGS. 11A-11C, method 100 at operation 112 removes the portions of the dummy gate stack 210b exposed by the opening 230 to form a trench 232 between the top gate spacers 212a. In the present embodiments, method 100 at operation 112 implements an etching process 304 to selectively remove the dummy gate electrode 209 including the poly-Si layer from the dummy gate stack 210b without removing, or substantially removing, the IL 211, the top gate spacers 212a, or the HM 224. The etching process 304 may be a dry etching process, a wet etching process, an RIE process, or combinations thereof that implements a suitable etchant.

Now referring to FIGS. 12A-12C, method 100 at operation 114 removes portions of the device 200 exposed by the trench 232 in an etching process 306. In the present embodiments, the etching process 306 removes the IL 211, the non-channel layers 205, the channel layers 206, at least portions of the substrate 202, and any other material layers exposed by the trench 232. In other words, the etching process 306 extends the trench 232 vertically downward to expose the substrate 202. Because the various material layers exposed by the trench 232 have different compositions, the etching process 306 may not get selective toward a particular composition. In other words, the etching process 306 implements a different etchant from that of the etching process 304, which selectively removes the dummy gate electrode 209 without removing, or substantially removing, the IL 211. In some embodiments, the etching process 306 is a dry etching process, a wet etching process, an RIE process, or combinations thereof. In some embodiments, the etching process 306 implements different etchants to remove the IL 211, the channel layers 206, and the non-channel layers 205. In the present embodiments, the trench 232 extends to below a bottom surface of the ML. In other words, a bottom surface of the trench 232 is defined by the substrate 202. In the present embodiments, the trench 232 extends vertically beyond the bottommost non-channel layer 205. In some embodiments, as depicted in FIG. 12A, the trench 232 extends vertically beyond a bottom surface of the epitaxial S/D features 214 by a distance H, where H is greater than or equal to zero.

Referring to FIGS. 13A-13C, method 100 at operation 116 deposits a dielectric liner 240 over the device 200, such that the dielectric liner 240 is formed conformally over the trench 232 and over a top surface of the HM 228. In some embodiments, the dielectric liner 240 includes silicon oxide, SiN, SiCN, SiOC, SiON, SiOCN, other suitable materials, or combinations thereof. In the present embodiments, the dielectric liner 240 is configured to have a composition different from that of the HM 224 and a fill layer 244 subsequently formed in the trench 232 to ensure that the dielectric liner 240 possesses etching selectivity with respect to these material layers. Accordingly, in an example embodiment, the dielectric liner 240 includes silicon oxide (SiO and/or $SiO_2$), while the HM 224 includes a nitride material (e.g., SiN) and the fill layer 244 includes amorphous Si (a-Si) and/or aluminum oxide ($Al_2O_3$). The dielectric liner 240 may be formed by any suitable deposition process, including ALD, CVD, PVD, other suitable process, or combinations thereof.

Still referring to FIGS. 13A-13C, method 100 at operation 118 forms the fill layer 244 over the dielectric liner 240, thereby filling the trench 232. In the present embodiments, the fill layer 244 is a dummy (or placeholder) layer for forming a CPODE structure that includes an air gap. In the present embodiments, the fill layer 244 includes a-Si, $Al_2O_3$, or a combination thereof, and as discussed above, the fill layer 244 is configured to have a composition different from that of the dielectric liner 240, such that the two layers can be etched in a selective manner. In some embodiments, the fill layer 244 includes a material that is compositionally distinct from other dielectric components in its vicinity to avoid inadvertent damage when a subsequent etching process is applied. For example, the fill layer 244 is substantially free of silicon oxide, SiN, SiCN, SiOC, SiON, SiOCN, other suitable materials, or combinations thereof, that may be included in the composition of the dielectric liner 240. The fill layer 244 may be formed by any suitable method, including CVD, FCVD, ALD, PVD, other methods, or combinations thereof. Referring to FIGS. 14A-14C, method 100 at operation 118 subsequently removes the HM 228 (and portions of the fill layer 244) by one or more CMP process along the dotted line as shown in FIGS. 13A-13C, thereby planarizing the top surface of the dummy gate electrode 209 with a top surface of the fill layer 244.

Referring to FIGS. 15A-15C, method 100 at operation 120 removes the dummy gate electrode 209 to form a trench 246 between the top gate spacers 212a in an etching process 308. In the present embodiments, the etching process 308 selectively removes the dummy gate electrode 209 of the dummy gate stack 210a without removing, or substantially removing, the IL 211 and the fill layer 244. In some embodiments, the etching process 308 is implemented with a dry etching process, a wet etching process, RIE, or combinations thereof. For example, the etching process 308 may include implementing a combination of a dry etching process and a wet etching process utilizing suitable etchants. In some embodiments, as depicted herein, the etching process 308 also removes to portions of the top gate spacers 212a, such that a height of the top gate spacers 212a is lower than the GH.

In some embodiments, referring to FIGS. 16A-16C, method 100 at operation 120 selectively removes the IL 211 without removing, or substantially removing, other components of the device 200 in an etching process 310, which may utilize a different etchant from that of the etching process 308. In some embodiments, the etching process 310 is optional, i.e., the IL 211 remains over the ML throughout the subsequent operations of method 100.

Now referring to FIGS. 17A-17C, method 100 at operation 122 removes the non-channel layers 205 from the ML to form openings 250 between the channel layers 206 along the Z axis and between the inner gate spacers 212b along the X axis in a sheet formation, or sheet release, process 312. In the present embodiments, the sheet formation process 312 selectively removes the non-channel layers 205 without removing, or substantially removing, the channel layers 206. In other words, the openings 250 are interleaved with the channel layers 206. In some embodiments, the sheet formation process 312 is implemented in a series of etching and trimming processes. In one example, a wet etching process employing an oxidant (or oxidizer) such as ozone ($O_3$; dissolved in water), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof may be performed to selectively remove the non-channel layers 205.

Subsequently, method 100 at operation 122 may form an IL (not depicted) in the trench 246 and on portions of the channel layers 206 exposed in the openings 250. The IL may be substantially the same to the IL 211 in composition and may be formed by chemical oxidation, thermal oxidation, other suitable methods, or combinations thereof. A cleaning process may be subsequently performed after forming the IL.

Referring to FIGS. 18A-18C, method 100 at operation 124 forms a metal gate stack 260 in the trench 246 (e.g., over the IL formed at operation 122) and the openings 250, such that portions of the metal gate stack 260 formed in the openings 250 are interleaved with or wrapping around the channel layers 206. In the present embodiments, the metal gate stack 260 includes a gate dielectric layer 262 and a metal gate electrode 264 over the gate dielectric layer 262. The gate dielectric layer 262 may include a high-k (having a dielectric constant greater than that of silicon oxide, which is approximately 3.9) dielectric material, such as hafnium oxide, lanthanum oxide, other suitable materials, or combinations thereof. The metal gate electrode 264 includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The metal gate stack 260 may further include other material layers (not depicted), such as a capping layer, a barrier layer, other suitable layers, or combinations thereof. Material layers of the metal gate stack 260 may be formed by various methods, including ALD, CVD, PVD, plating, other suitable methods, or combinations thereof.

Subsequently, still referring to FIGS. 18A-18C and to FIGS. 19A-19C, method 100 at operation 124 planarizes the top surface of the device 200 by implementing one or more CMP process. In some embodiments, as depicted in FIGS. 18A-18C, method 100 first deposits a dielectric layer 266 over the metal gate electrode 264 by a suitable method, such as CVD, ALD, PVD, other suitable methods, or combinations thereof. The dielectric layer 266 may include any suitable dielectric material, such as SiN. In some embodiments, the dielectric layer 266 is configured to provide uniform polishing while implementing the CMP process(es) across the top surface of the device 200. Thereafter, method 100 implements the one or more CMP process along the dotted line, such that a top surface of the metal gate electrode 264 is planarized with the top surface of the fill layer 244 as depicted in FIGS. 19A-19C. Accordingly, comparing with the device 200 as depicted in FIGS. 3A-3C, one of the dummy gate stacks (i.e., the dummy gate stack 210a) has been replaced in its entirety with a metal gate stack (i.e., the metal gate stack 260), while the other one of the dummy gate stacks (i.e., the dummy gate stack 210b) has been at least partially replaced with the fill layer 244.

Now referring to FIGS. 20A-20C, method 100 at operation 126 recesses or etches back a top portion of the metal gate stack 260 to form a trench 268 in an etching process 314. In the present embodiments, the etching process 314 selectively removes the top portion of the metal gate stack 260, including at least portions of the gate dielectric layer 262 and the metal gate electrode 264, without removing, or substantially removing, portions of the fill layer 244 or the dielectric liner 240. The etching process 314 may be implemented by any suitable method, including a dry etching process, a wet etching process, RIE, other suitable methods, or combinations thereof, utilizing one or more etchant configured to etch components of the metal gate stack 260. In the present embodiments, a depth of the trench 268 is controlled by tuning one or more parameters, such as etching duration, of the etching process 314, where a longer etching duration increases the depth of the trench 268. In some embodiments, a dielectric layer (e.g., dielectric capping layer 270 as discussed below) is then deposited in the trench 268 to provide self-alignment capability and/or to enhance etching selectivity between various components of the device 200 during the subsequent fabrication processes, including, for example, gate contact formation and CPODE formation.

Referring to FIGS. 21A and 21B, which depict embodiments of a portion of the device 200 alternative to that shown in FIG. 19A, a gate length $L_g$ of the metal gate stack 260 may be large enough to accommodate the formation of a dielectric layer 269 embedded in the metal gate electrode 264, which is subsequently etched back to form the trench 268 similar to that shown in FIG. 20A and discussed above. Forming the dielectric layer 269 may include patterning the metal gate electrode 264 to form an opening (not depicted) and subsequently deposit a dielectric material in the opening to form the dielectric layer 269. In some embodiments, the dielectric layer 269 includes one or more suitable dielectric material configured to provide etching selectivity with respect to the dielectric liner 240 and the fill layer 244.

Now referring to FIGS. 22A-22C, method 100 at operation 128 deposits a dielectric capping layer 270 over the device 200, thereby filling the trench 268. As discussed above, the dielectric capping layer 270 is configured to accommodate subsequent fabrication processes by providing self-alignment capability and enhancing etching selectivity with other components of the device 200, including the fill layer 244 and the dielectric liner 240. Accordingly, in the present embodiments, the dielectric capping layer 270 has a composition different from that of the fill layer 244 and the dielectric liner 240. In some embodiments, the dielectric capping layer 270 includes SiN, SiCN, SiOC, SiON, SiOCN, other suitable materials, or combinations thereof. In an example embodiment in which the dielectric liner 240 includes silicon oxide and the fill layer 244 includes a-Si and/or $Al_2O_3$, the dielectric capping layer 270 includes a nitrogen-containing dielectric material such as SiN and/or SiCN and is free or substantially free of silicon oxide, a-Si, and $Al_2O_3$. The dielectric capping layer 270 may be deposited by any suitable methods, including ALD, CVD, PVD, other suitable methods, or combinations thereof. Subsequently, referring to FIGS. 23A-23C, method 100 at operation 128 removes portions of the dielectric capping layer 270 formed over the fill layer 244 in one or more CMP process along the dotted line shown in FIGS. 22A-22C, thereby planarizing the top surface of the device 200. In some examples, as depicted herein, the CMP process(es) at operation 128 may also remove top portions of the HM 224.

Thereafter, collectively referring to FIGS. 24A-31C, method 100 proceeds to forming a CPODE (i.e., CPODE 290A as depicted in FIGS. 27A-27C or CPODE 290B as depicted in FIGS. 31A-31C) in place of the fill layer 244 (and the dielectric liner 240), where the CPODE includes a dielectric layer (e.g., dielectric layer 284A as depicted in FIGS. 26A-27C or dielectric layers 284B and 284C as depicted in FIGS. 28A-31C) and an air gap (e.g., air gap 282 as depicted in FIGS. 26A-27C or air gap 288 as depicted in FIGS. 31A-31C). In the present embodiments, the air gap is configured to reduce the parasitic capacitance of the device 200, especially between two adjacent active device regions, thereby improving the RC delay and/or other aspects of the device performance.

Referring to FIGS. 24A-24C, method 100 at operation 130 removes the fill layer 244 to form a trench 280 in an etching process 316. In the present embodiments, the etching process 316 selectively removes the fill layer 244 without removing, or substantially removing, the dielectric capping layer 270 and the dielectric liner 240, among other components of the device 200, thereby exposing the dielectric liner 240 in the trench 280. In other words, the etching process 316 is configured to stop on the dielectric liner 240. The etching process 316 may be implemented by any suitable method, including a dry etching process, a wet etching process, an RIE process, other suitable processes, or combinations thereof. In an example embodiment, the etching process 316 is a wet etching process utilizing a hydroxide-based etchant such as ammonium hydroxide ($NH_4OH$), potassium hydroxide (KOH), other hydroxide-based etchant, an acid such as nitric acid ($HNO_3$), phosphoric acid ($H_3PO_4$), other suitable acids, or combinations thereof. In another example embodiment, the etching process 316 is a dry etching process utilizing a fluorine-based etchant such as $CF_4$, $SF_6$, $CH_2F_2$, $CHF_3$, $C_2F_6$, HF, other fluorine-based etchants, or combinations thereof.

Collectively referring to FIGS. 25A-27C, method 100 proceeds from operation 130 to forming the CPODE 290A with the air gap 282 embedded in the dielectric layer 284A in operations 132 and 134. In other words, the dielectric layer 284A of the CPODE 290A separates the air gap 282 from other components of the device 200. Referring to FIGS. 25A-25C, method 100 at operation 132 removes the dielectric liner 240 from the trench 280 in an etching process 318. In the present embodiments, the etching process 318 selectively removes the dielectric liner 240 without removing, or substantially removing, the top gate spacers 212a, the dielectric capping layer 270, or other components of the device 200. The etching process 318 may include a dry etching process, a wet etching process, an RIE process, other suitable processes, or combinations thereof. In the present embodiments, the etching process 318 utilizes an etchant that is different from that of the etching process 316, which selectively removes the fill layer 244 with respect to the dielectric liner 240.

Now referring to FIGS. 26A-26C, method 100 at operation 134 deposits the dielectric layer 284A in the trench 280 in a deposition process 320. In the present embodiments, the deposition process 320 partially fills the trench 280 with the dielectric layer 284A, such that the air gap 282 is embedded in the dielectric layer 284A. In other words, the deposition process 320 forms the dielectric layer 284A on sidewall and bottom surfaces of the trench 280, and upon merging across the top opening of the trench 280, seals the air gap 282 in the dielectric layer 284A. The dielectric layer 284A may include any suitable material, such as SiN, SiCN, SiOC, SiON, SiOCN, a low-k dielectric material, TEOS, silicon oxide, doped silicon oxide (e.g., BPSG, FSG, PSG, BSG, etc.), other suitable materials, or combinations thereof. In one such example, the dielectric layer 284A includes SiN. In some embodiments, the dielectric layer 284A has substantially the same composition as the dielectric capping layer 270. For example, both the dielectric capping layer 270 and the dielectric layer 284A may include SiN. In some embodiments, the composition of the dielectric layer 284A is selected to reduce or minimize the parasitic capacitance of the device 200 by including dielectric materials with lower k values (dielectric constants). In the present embodiments, because air has a k value of 1, which is less than the k value of the dielectric layer 284A, the overall capacitance of the CPODE 290A is reduced by the presence of the air gap 282.

The deposition process 320 may be implemented with a suitable method, including PVD, CVD, FCVD, other methods, or combinations thereof. In the present embodiments, the deposition process 320 is implemented by PVD during which the dielectric layer 284A is formed by growing in a bottom-up process. As a result, a bottom portion of the thus-formed dielectric layer 284A (labeled by the dotted circle) may include a curved surface as shown in an enlarged view. Alternatively or additionally, one or more parameter of the deposition process 320 may be adjusted to form the air gap 282 in the dielectric layer 284A. In some embodiments, for example, increasing the rate at which the dielectric layer 284A is deposited (by PVD and/or other deposition methods) causes the top opening of the trench 280 to merge more quickly than the bulk of the trench 280 being filled, resulting in the creation of the air gap 282 trapped in the dielectric layer 284A. As such, a volume of the air gap 282 may be adjusted by tuning the rate of deposition of the dielectric layer 284A during the deposition process 320. In some embodiments, a top portion of the dielectric layer 284A that seals the air gap 282 has a thickness less than that of the bottom portion of the dielectric layer 284A. In some embodiments, one or more parameter of the deposition process 320 are adjusted such that a volume of the air gap 282 may exceed that of the dielectric layer 284A. In some examples, the volume of the air gap 282 exceeds about 50% of the total volume of the CPODE 290A.

Subsequently, referring to FIGS. 27A-27C, method 100 at operation 134 implements one or more CMP process along the dotted line as shown in FIGS. 26A-26C to remove excess dielectric layer 284A formed over the dielectric capping layer 270, thereby completing fabrication of the CPODE 290A. As discussed above, the CPODE structure is generally an insulating structure configured as a scaling tool to improve density of devices (e.g., FETs). To achieve desired scaling effect while maintaining the devices' proper functions (e.g., avoiding electrical shorting), a CPODE structure may be formed between boundaries of such devices (i.e., between, for example, S/D contacts formed subsequently over the epitaxial S/D features 214), such that the separation distance between adjacent devices may be reduced or minimized without compromising device performance. The present embodiments provide methods of introducing air gap into the CPODE (e.g., the CPODE 290A and the CPODE 290B) in an effort to reduce the parasitic capacitance of the devices and boost the performance thereof.

In some embodiments, collectively referring to FIGS. 28A-31C, method 100 proceeds from operation 130 to forming the CPODE 290B having the air gap 288 surrounding portions of the dielectric layer 284B in operations 136 and 138. In other words, the air gap 288 separates portions of the dielectric layer 284B from other components of the device 200. As depicted in FIGS. 31A and 31C, the CPODE 290B further includes a dielectric layer 284C that seals a top portion of the air gap 288. In the present embodiments, a volume of the dielectric layer 284B exceeds that of the air gap 288.

Referring to FIGS. 28A-28C, method 100 at operation 136 deposits the dielectric layer 284B over the dielectric liner 240 in a deposition process 322. The dielectric layer 284B may include any suitable material provided above with respect to the dielectric layer 284A. In some embodiments, the dielectric layer 284B has substantially the same composition as the dielectric layer 284A and/or the dielectric capping layer 270. In one such example, the dielectric layer 284B includes SiN. In some embodiments, because the volume of the dielectric layer 284B exceeds that of the air gap 288, the composition of the dielectric layer 284B is selected to have a lower k value than that of the dielectric layer 284A in order to minimize the parasitic capacitance of the device 200. In one such example, if the dielectric layer 284A includes SiN, then the dielectric layer 284B may include, for example, silicon oxide, a low-k dielectric material, TEOS, doped silicon oxide (e.g., BPSG, FSG, PSG, BSG, etc.), other suitable materials, or combinations thereof.

Different from the deposition process 320, the deposition process 322 deposits the dielectric layer 284B to completely fill the trench 280, rather than intentionally leaving an air gap trapped therein. In other words, the deposition process 322 is controlled such that portions of the dielectric layer 284B formed on sidewall and bottom surfaces of the trench 280 merge completely to fill the trench 280 before its top opening is sealed. The deposition process 322 may be implemented by any suitable method, including CVD, FCVD, PVD, other methods, or combinations thereof. Subsequently, referring to FIGS. 29A-29C, method 100 at operation 138 implements one or more CMP process along the dotted line as shown in FIGS. 28A-28C to remove excess dielectric layer 284B and expose the dielectric capping layer 270.

Now referring to FIGS. 30A-30C, method 100 at operation 138 removes the dielectric liner 240 to form the air gap 288 in an etching process 324. In the present embodiments, the etching process 324 selectively removes the dielectric liner 240 without removing, or substantially removing, the dielectric layer 284B and the dielectric capping layer 270, among other components of the device 200. Thus, in the present embodiments, a thickness of the dielectric liner 240 defines the volume of the air gap 288. In some embodiments, the thickness of the dielectric liner 240 is less than about 15 nm. Accordingly, in at least some embodiments, the volume of the air gap 288 is less than the volume of the dielectric layer 284B and that of the air gap 282. In some examples, the volume of the air gap 288 does not exceed about 50% of the total volume of the CPODE 290B. The etching process 324 may include a dry etching process, a wet etching process, an RIE process, other suitable processes, or combinations thereof. For embodiments in which the dielectric layer 284B and the dielectric capping layer 270 have substantially the same compositions, the etching process 324 may be substantially the same (e.g., utilizing the same etchant(s) and/or etching parameters, etc.) as the etching process 318 discussed above with respect to FIGS. 25A-25C.

Subsequently, referring to FIGS. 31A-31C, method 100 at operation 140 deposits the dielectric layer 284C over the device 200, thereby partially filling or sealing the air gap 288. The dielectric layer 284C may include any suitable material, including silicon oxide, SiN, SiCN, SiOC, SiON, SiOCN, a low-k dielectric material, TEOS, silicon oxide, doped silicon oxide (e.g., BPSG, FSG, PSG, BSG, etc.), other suitable materials, or combinations thereof, and may be deposited by any suitable method, such as CVD, ALD, other methods, or combinations thereof. In some embodiments, the dielectric layer 284C has substantially the same composition as the dielectric capping layer 270, the dielectric layer 284A, and/or the dielectric layer 284B. In one example embodiment, the dielectric layer 284C includes SiN. In the present embodiments, portions of the dielectric layer 284C are formed to seal the air gap 288, such that a top portion of the dielectric layer 284B is interposed between the dielectric layer 284C. Subsequently, method 100 at operation 140 implements one or more CMP process (not depicted) to remove excess dielectric layer 284C formed over the dielectric layer 284B, thereby completing fabrication of the CPODE 290B.

Referring to FIGS. 32A-32C and as discussed above with respect to FIGS. 10A-10C, the present embodiments do not limit the length of the CPODE 290A along the Y axis. In other words, the CPODE 290A may be configured to replace portions of the dummy gate stack 210b disposed over one (FIG. 32A), two (FIG. 32B), or all three (FIG. 32C) of the fins 204a-204c, while the remainder of the dummy gate stack 210b is replaced with the metal gate stack 260 in a series of processes discussed above with respect to operation 124. Similarly, referring to FIGS. 33A-33C, the length of the CPODE 290B along the Y axis may also vary, such that the CPODE 290B is formed over one (FIG. 33A), two (FIG. 33B), or all three (FIG. 33C) of the fins 204a-204c.

Although the present embodiments depict forming the CPODE 290A (or the CPODE 290B) before forming the metal gate stack 260, it is noted that method 100 may alternatively form the CPODE 290A or the CPODE 290B in place of the placeholder gate 210b first before forming the metal gate stack 260 by, for example, implementing operations 130, 132, and 134 or operations 130, 136, 138, and 140 first and then implementing operations 120-128. In other words, the present embodiments do not limit the order in which the metal gate stack 260 and the CPODEs are formed.

Thereafter, referring to FIG. 2B and further to FIG. 34A (and 34B, which is a planar top view of 34A) and 34C (and 34D, which is a planar top view of 34C) that correspond to FIGS. 27A and 31A, respectively, method 100 at operation 142 forms S/D contacts 294 over the epitaxial S/D features 214. In the present embodiments, forming the S/D contacts 294 includes forming an ILD layer 292 (not depicted in FIGS. 34B and 34D) over the device 200, where the ILD layer 292 may be substantially the same as the ILD layer 218 in composition. An ESL (not depicted) similar to the ESL 217 may be first deposited over the device 200 before forming the ILD layer 292. Subsequently, S/D contact holes (or trenches; not depicted) are formed in the ILD layers 292 and 218 via a series of patterning and etching processes and a conductive material is deposited in the S/D contact holes using any suitable method, such as CVD, ALD, PVD, plating, other suitable processes, or combinations thereof, to form the S/D contacts 294. Each S/D contact 294 may include any suitable conductive material, such as Co, W, Ru, Cu, Al, Ti, Ni, Au, Pt, Pd, other suitable conductive materials, or combinations thereof. A barrier layer (not depicted) including TiN, TaN, other suitable materials, or combinations thereof may be formed in the S/D contact holes before depositing the conductive material. In some embodiments, a silicide layer (not depicted) is formed between the epitaxial S/D features 214 and the S/D contacts 294. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a series of suitable processes, including deposition, silicidation, etching back, and annealing.

Still referring to FIGS. 34A and 34B, in the present embodiments, the CPODE 290A and 290B each extend to below the bottommost channel layer 206 (i.e., into the substrate 202), while the bottom portion of the metal gate stack 260 is interleaved with the channel layers 206. In other words, the CPODE 290A and 290B each extends vertically to below the bottom portion of the metal gate stack 260. Furthermore, in some embodiments, a width of the CPODE 290A and 290B decreases from top to bottom as a result of the profile of the trench 232 created during the etching processes 304 and 306 (see FIGS. 11A and 12A for example).

Subsequently, method 100 at operation 144 forms additional features, such as a multi-layer interconnect (MLI) structure (not depicted) over the device 200. The MLI may include various interconnect features, such as vias and conductive lines, disposed in dielectric layers, such as ESLs and ILD layers. In some embodiments, the vias are vertical interconnect features configured to interconnect device-level contacts, such as the S/D contacts 294 and gate contacts (not depicted) formed over the metal gate stack 260, with the MLI and between the conductive lines, which are horizontal interconnect features. The ESLs and the ILD layers of the MLI may have substantially the same compositions as those discussed above with respect to the ESL 217 and the ILD layer 218, respectively. The vias and the conductive lines may each include any suitable conductive material, such as Co, W, Ru, Cu, Al, Ti, Ni, Au, Pt, Pd, other suitable conductive materials, or combinations thereof, and be formed by a series of patterning and deposition processes. Additionally, each via and conductive line may additionally include a barrier layer similar to that discussed above with respect the barrier layer of the S/D contact 294.

Although not intended to be limiting, one or more embodiments of the present disclosure provide many benefits to a semiconductor device and the formation thereof. For example, the present disclosure provides a CPODE structure, and methods of forming the same, disposed between two active device regions and configured to include an air gap and a dielectric layer. In some embodiments, the CPODE structure includes the air gap embedded in the dielectric layer. In some embodiments, the CPODE structure includes the air gap surrounding the dielectric layer, and the air gap is partially filled with a seal layer. In some embodiments, the active device regions each include a multi-gate FET, such as an NS FET. In the present embodiments, besides offering scaling capability to accommodate fabrication of devices at advanced technology nodes, the CPODE structure with the inclusion of the air gap allows reduction of the parasitic capacitance in a region disposed between two active devices, thereby improving the overall performance of the devices. Embodiments of the disclosed methods can be readily integrated into existing processes and technologies for manufacturing NS FETs.

In one aspect, the present embodiments provide a semiconductor structure that includes semiconductor layers disposed over a substrate and oriented lengthwise in a first direction, a metal gate stack disposed over the semiconductor layers and oriented lengthwise in a second direction perpendicular to the first direction, where the metal gate stack includes a top portion and a bottom portion that is interleaved with the semiconductor layers, S/D features disposed in the semiconductor layers and adjacent to the metal gate stack, and an isolation structure protruding from the substrate, where the isolation structure is oriented lengthwise along the second direction and spaced from the metal gate stack along the first direction, and where the isolation structure includes a dielectric layer and an air gap.

In another aspect, the present embodiments provide a method that includes forming a semiconductor fin protruding from a substrate, where the semiconductor fin includes alternating silicon (Si) layers and silicon germanium (SiGe) layers, forming two placeholder gates over the semiconductor fin, where the placeholder gates are oriented lengthwise perpendicular to the semiconductor fin, removing a portion of one of the placeholder gates to form a trench, thereby exposing the substrate, forming a dummy feature in the trench, replacing the other one of the placeholder gates with a metal gate structure, and replacing the dummy feature with an isolation gate, where the isolation gate includes a dielectric layer and an air gap, and where the isolation gate is spaced from the metal gate structure along the lengthwise orientation of the semiconductor fin.

In yet another aspect, the present embodiments provide a method that includes forming a semiconductor fin protruding from a substrate, forming two placeholder gates over the semiconductor fin, where the placeholder gates are oriented lengthwise perpendicular to the semiconductor fin, forming an S/D feature over the semiconductor fin and interposed between the placeholder gates, removing a portion of one of the placeholder gates disposed over the semiconductor fin to form a first trench, thereby exposing the substrate, depositing a liner in the first trench, forming a dummy layer over the liner to fill the first trench, where the dummy layer and the liner have different compositions, forming a metal gate structure in place of the other one of the placeholder gates, and forming an isolation gate structure in place of the liner and the dummy layer. In the present embodiments, forming the isolation gate structure further includes selectively removing the dummy layer with respect to the metal gate structure, thereby exposing the liner in a second trench, depositing a dielectric layer over the liner in the second trench, where the dielectric layer, the liner, and the dummy layer have different compositions, selectively removing the liner with respect to the dielectric layer to form an air gap, and sealing the air gap, resulting in the isolation gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a semiconductor fin protruding from a substrate, wherein the semiconductor fin comprises a vertical stack of alternating channel layers and sacrificial layers, and
      a gate structure engaging the semiconductor fin;
   removing a first portion of the gate structure and a portion of the semiconductor fin disposed directly under the first portion of the gate structure to form an isolation trench; and
   forming an isolation structure in the isolation trench, wherein the isolation structure includes a dielectric layer and an air gap.

2. The method of claim 1, wherein the forming of the isolation structure comprises:
   conformally forming a first material to partially fill the isolation trench;
   depositing a second material over the first material to a remaining portion of the isolation trench; and
   replacing the first material and the second material with the isolation structure.

3. The method of claim 2, wherein a composition of the first material is different than a composition of the second material.

4. The method of claim 2, wherein the second material comprises amorphous Si (a-Si) and/or aluminum oxide ($Al_2O_3$).

5. The method of claim 2, wherein the replacing of the first material and the second material with the isolation structure comprises:
- selectively removing the second material;
- selectively removing the first material; and
- depositing a third material over the workpiece and in the isolation trench to form the isolation structure, wherein the isolation structure comprises the air gap embedded in the third material.

6. The method of claim 2, further comprising:
- after the forming of the first material and the second material in the isolation trench, replacing a remaining portion of the gate structure with a metal gate stack.

7. The method of claim 2,
- wherein the semiconductor fin is a first semiconductor fin, the workpiece further comprises a second semiconductor fin protruding from the substrate and comprising a vertical stack of alternating channel layers and sacrificial layers, wherein the gate structure further comprises a second portion disposed directly over the second semiconductor fin,
- wherein the method further comprises:
- after the forming of the first material and second material in the isolation trench;
- selectively removing the second portion of the gate structure;
- selectively removing the sacrificial layers; and
- forming a metal gate stack wrapping around and over the channel layers of the second semiconductor fin.

8. The method of claim 1, wherein the forming of the isolation structure comprises:
- conformally forming a first material to partially fill the isolation trench;
- depositing a second material over the first material to a remaining portion of the isolation trench;
- replacing the second material with a third material; and
- after the replacing of the second material with the third material, selectively removing the first material to form the air gap.

9. The method of claim 8, further comprising:
- after the depositing of the second material, replacing a remaining portion of the gate structure with a metal gate stack,
- wherein the air gap is formed after forming the metal gate stack.

10. A method, comprising:
- forming a multi-layer structure having alternating channel layers and sacrificial layers over a substrate;
- patterning the multi-layer structure to form a semiconductor fin;
- forming a first placeholder gate directly over a first region of the semiconductor fin and a second placeholder gate directly over a second region of the semiconductor fin;
- removing the first placeholder gate and the first region of the semiconductor fin to form a trench;
- forming a dummy feature in the trench;
- selectively removing the second placeholder gate and the sacrificial layers in the second region of the semiconductor fin to form gate openings;
- forming a metal gate structure in the gate openings; and
- after the forming of the metal gate structure, replacing the dummy feature with an isolation structure.

11. The method of claim 10, wherein the forming of the dummy feature comprises:
- depositing a dielectric liner to partially fill the trench; and
- forming a fill layer over the dielectric liner to fill a remaining portion of the trench, wherein the dielectric liner and the fill layer have different compositions.

12. The method of claim 11, wherein the replacing of the dummy feature with the isolation structure comprises:
- selectively removing the fill layer to expose the dielectric liner;
- selectively removing the dielectric liner; and
- depositing a dielectric layer in the trench, wherein the depositing of the dielectric layer further forms an air gap embedded in the dielectric layer.

13. The method of claim 11, wherein the replacing of the dummy feature with the isolation structure comprises:
- selectively removing the fill layer to expose the dielectric liner;
- depositing a dielectric layer over the dielectric liner; and
- selectively removing the dielectric liner with respect to the dielectric layer, thereby forming an air gap surrounding the dielectric layer.

14. The method of claim 13, further comprising:
- after the selectively removing of the dielectric liner, depositing a dielectric material to seal the air gap.

15. A method, comprising:
- forming a fin-shaped structure over a substrate;
- forming a first placeholder gate and a second placeholder gate engaging the fin-shaped structure;
- removing a portion of the first placeholder gate and a portion of the fin-shaped structure disposed directly under the portion of the first placeholder gate to form a trench;
- depositing a dummy liner in the trench;
- forming a dummy layer over the dummy liner to fill the trench, wherein the dummy layer and the dummy liner have different compositions;
- forming a metal gate structure in place of the second placeholder gate; and
- after the forming of the metal gate structure, replacing the dummy liner and dummy layer with an isolation structure.

16. The method of claim 15, wherein the replacing of the dummy liner and dummy layer with the isolation structure comprises:
- selectively removing the dummy layer with respect to the metal gate structure and the dummy liner;
- after the selectively removing of the dummy layer, selectively removing the dummy liner; and
- forming the isolation structure in the trench.

17. The method of claim 16, wherein the forming of the isolation structure comprises performing a deposition process to forming a dielectric layer in the trench, wherein the performing of the deposition process further forming an air gap enclosed in the dielectric layer.

18. The method of claim 15, wherein the forming of the dummy layer includes forming amorphous silicon, aluminum oxide, or a combination thereof over the dummy liner.

19. The method of claim 15, wherein the isolation structure is in direct contact with a gate spacer having a non-linear interface.

20. The method of claim 15, wherein a bottom surface of the isolation structure is lower than a bottommost portion of the metal gate structure.

* * * * *